(12) United States Patent
Ferrasse et al.

(10) Patent No.: US 8,702,919 B2
(45) Date of Patent: Apr. 22, 2014

(54) TARGET DESIGNS AND RELATED METHODS FOR COUPLED TARGET ASSEMBLIES, METHODS OF PRODUCTION AND USES THEREOF

(75) Inventors: Stephane Ferrasse, Veradale, WA (US);
Werner H. Hort, Cranberry, PA (US);
Jaeyeon Kim, Spokane, WA (US);
Frank C. Alford, Veradale, WA (US)

(73) Assignee: Honeywell International Inc., Morristown, NJ (US)

( * ) Notice: Subject to any disclaimer, the term of this patent is extended or adjusted under 35 U.S.C. 154(b) by 1143 days.

(21) Appl. No.: 11/838,166

(22) Filed: Aug. 13, 2007

(65) Prior Publication Data

US 2009/0045051 A1    Feb. 19, 2009

(51) Int. Cl.
*C23C 14/34*    (2006.01)

(52) U.S. Cl.
USPC ............... 204/298.12; 204/298.13; 228/107; 228/110.1; 228/112.1; 228/115; 228/135; 228/193

(58) Field of Classification Search
USPC ............ 204/298.12, 298.13; 228/107, 110.1, 228/112.1, 115, 135, 193
See application file for complete search history.

(56) References Cited

U.S. PATENT DOCUMENTS

| | | | |
|---|---|---|---|
| 4,135,286 A * | 1/1979 | Wright et al. | 419/8 |
| 4,855,033 A | 8/1989 | Hurwitt | |
| 5,009,765 A * | 4/1991 | Qamar et al. | 204/298.12 |
| 5,115,082 A | 5/1992 | Mercer et al. | |
| 5,143,590 A * | 9/1992 | Strothers et al. | 204/298.12 |
| 5,271,817 A | 12/1993 | Brugge et al. | |
| 5,400,633 A | 3/1995 | Segal et al. | |
| 5,513,512 A | 5/1996 | Segal | |

(Continued)

FOREIGN PATENT DOCUMENTS

| | | |
|---|---|---|
| EP | 0634498 | 1/1995 |
| EP | 0799905 | 10/1997 |

(Continued)

OTHER PUBLICATIONS

Machine Translation of Japan 2000-265265 dated Sep. 26, 2000.*

(Continued)

*Primary Examiner* — Rodney McDonald
(74) *Attorney, Agent, or Firm* — Faegre Baker Daniels LLP

(57) ABSTRACT

Sputtering targets are described that comprise: a) a target surface component comprising a target material; b) a core backing component having a coupling surface, a back surface and at least one open area, wherein the coupling surface is coupled to at least part of the target surface component; and wherein at least part of the target surface component fits into at least one open area of the core backing component. In some embodiments, the target surface component, the core backing component or a combination thereof have at least one surface area feature coupled to or located in the back surface of the core backing component, the target surface component or a combination thereof, wherein the surface area feature increases the cooling effectiveness of the target surface component. Methods of forming a sputtering target are also described that comprises: a) providing a target surface component comprising a surface material; b) providing a core backing component having a coupling surface, a back surface and at least one open area; c) coupling the coupling surface to at least part of the target surface component, wherein at least part of the target surface component fits into the at least one open area of the core backing component.

20 Claims, 13 Drawing Sheets

(56) References Cited

U.S. PATENT DOCUMENTS

| | | |
|---|---|---|
| 5,590,389 A | 12/1996 | Dunlop et al. |
| 5,600,989 A | 2/1997 | Segal et al. |
| 5,620,537 A | 4/1997 | Bampton |
| 5,628,889 A * | 5/1997 | Gardell et al. ............ 204/298.09 |
| 5,674,367 A * | 10/1997 | Hunt et al. ............... 204/298.12 |
| 5,766,380 A | 6/1998 | Lo et al. |
| 5,780,755 A | 7/1998 | Dunlop et al. |
| 5,799,860 A | 9/1998 | Demaray et al. |
| 5,809,393 A | 9/1998 | Dunlop et al. |
| 5,826,456 A | 10/1998 | Kawazoe et al. |
| 5,904,062 A | 5/1999 | Semiatin et al. |
| 5,959,157 A | 9/1999 | Lau et al. |
| 5,986,045 A | 11/1999 | Lau et al. |
| 5,993,575 A | 11/1999 | Lo et al. |
| 6,022,812 A | 2/2000 | Smith et al. |
| 6,037,275 A | 3/2000 | Wu et al. |
| 6,042,994 A | 3/2000 | Yang et al. |
| 6,048,804 A | 4/2000 | Smith et al. |
| 6,073,830 A | 6/2000 | Hunt et al. |
| 6,090,448 A | 7/2000 | Wallace et al. |
| 6,124,421 A | 9/2000 | Lau et al. |
| 6,126,733 A | 10/2000 | Wallace et al. |
| 6,140,254 A | 10/2000 | Endisch et al. |
| 6,143,855 A | 11/2000 | Hacker et al. |
| 6,156,812 A | 12/2000 | Lau et al. |
| 6,171,687 B1 | 1/2001 | Leung et al. |
| 6,172,128 B1 | 1/2001 | Lau et al. |
| 6,193,821 B1 | 2/2001 | Zhang |
| 6,193,854 B1 | 2/2001 | Lai et al. |
| 6,197,129 B1 | 3/2001 | Zhu et al. |
| 6,204,202 B1 | 3/2001 | Leung et al. |
| 6,208,014 B1 | 3/2001 | Wu et al. |
| 6,214,746 B1 | 4/2001 | Leung et al. |
| 6,217,716 B1 | 4/2001 | Fai Lai |
| 6,238,494 B1 | 5/2001 | Segal |
| 6,283,357 B1 | 9/2001 | Kulkarni et al. |
| 6,303,733 B1 | 10/2001 | Lau et al. |
| 6,313,185 B1 | 11/2001 | Lau et al. |
| 6,318,124 B1 | 11/2001 | Rutherford et al. |
| 6,331,233 B1 | 12/2001 | Turner |
| 6,335,296 B1 | 1/2002 | Hendricks et al. |
| 6,342,133 B2 | 1/2002 | D'Couto et al. |
| 6,372,666 B1 | 4/2002 | Ramos et al. |
| 6,380,347 B1 | 4/2002 | Lau et al. |
| 6,395,651 B1 | 5/2002 | Smith et al. |
| 6,399,215 B1 | 6/2002 | Zhu et al. |
| 6,407,006 B1 | 6/2002 | Levert et al. |
| 6,410,149 B1 | 6/2002 | Hendricks et al. |
| 6,423,811 B1 | 7/2002 | Lau et al. |
| 6,444,105 B1 | 9/2002 | Lai et al. |
| 6,444,715 B1 | 9/2002 | Mukherjee et al. |
| 6,451,422 B1 | 9/2002 | Nguyen |
| 6,468,404 B2 | 10/2002 | Lu et al. |
| 6,469,123 B1 | 10/2002 | Lau et al. |
| 6,478,902 B2 | 11/2002 | Koenigsmann et al. |
| 6,495,479 B1 | 12/2002 | Wu et al. |
| 6,497,796 B1 | 12/2002 | Ashtiani et al. |
| 6,500,321 B1 | 12/2002 | Ashtiani et al. |
| 6,503,850 B1 | 1/2003 | Wallace et al. |
| 6,509,415 B1 | 1/2003 | Lau et al. |
| 6,555,250 B2 | 4/2003 | Shah et al. |
| 6,569,270 B2 | 5/2003 | Segal |
| 6,589,408 B1 | 7/2003 | Wang et al. |
| 6,589,889 B2 | 7/2003 | Endisch et al. |
| 6,605,199 B2 | 8/2003 | Perry et al. |
| 6,613,199 B1 | 9/2003 | Tobin et al. |
| 6,673,434 B2 | 1/2004 | Nguyen |
| 6,706,219 B2 | 3/2004 | Nguyen |
| 6,723,187 B2 | 4/2004 | Segal et al. |
| 6,725,522 B1 * | 4/2004 | Ivanov et al. ................... 29/525 |
| 6,770,572 B1 | 8/2004 | Wu et al. |
| 6,791,188 B2 | 9/2004 | Hagihara et al. |
| 6,797,382 B2 | 9/2004 | Nguyen et al. |
| 6,800,182 B2 | 10/2004 | Mitsui et al. |
| 6,849,139 B2 | 2/2005 | Kardokus et al. |
| 6,878,250 B1 | 4/2005 | Segal et al. |
| 6,883,359 B1 | 4/2005 | Hartwig, Jr. |
| 6,887,356 B2 | 5/2005 | Ford et al. |
| 6,895,795 B1 | 5/2005 | Chaudhury et al. |
| 6,896,748 B2 | 5/2005 | Perry et al. |
| 6,902,699 B2 | 6/2005 | Fritemeier et al. |
| 6,908,517 B2 | 6/2005 | Segal et al. |
| 6,908,588 B2 | 6/2005 | Wilhartitz et al. |
| 6,908,669 B2 | 6/2005 | Nguyen |
| 6,946,039 B1 | 9/2005 | Segal et al. |
| 6,992,261 B2 * | 1/2006 | Kachalov et al. .......... 219/78.02 |
| 7,017,382 B2 | 3/2006 | Segal et al. |
| 7,114,643 B2 | 10/2006 | Ivanov et al. |
| 7,172,711 B2 | 2/2007 | Nguyen |
| 7,244,491 B2 | 7/2007 | Nguyen |
| 7,767,043 B2 | 8/2010 | Segal et al. |
| 2001/0047838 A1 | 12/2001 | Segal et al. |
| 2001/0050939 A1 | 12/2001 | Ujazdowski et al. |
| 2002/0000272 A1 | 1/2002 | Segal et al. |
| 2002/0007880 A1 | 1/2002 | Segal et al. |
| 2002/0076543 A1 | 6/2002 | Sikonia |
| 2002/0125128 A1 | 9/2002 | Turner |
| 2002/0153071 A1 | 10/2002 | Segal et al. |
| 2004/0011440 A1 | 1/2004 | Perry et al. |
| 2004/0140019 A1 | 7/2004 | Bampton et al. |
| 2004/0141870 A1 | 7/2004 | Michaluk et al. |
| 2004/0256218 A1 | 12/2004 | Glass et al. |
| 2005/0016243 A1 | 1/2005 | Segal |
| 2005/0034503 A1 | 2/2005 | Spreckelsen et al. |
| 2005/0051606 A1 | 3/2005 | Perrot et al. |
| 2005/0126666 A1 | 6/2005 | Zhu et al. |
| 2005/0222323 A1 | 10/2005 | Zhou et al. |
| 2006/0040112 A1 | 2/2006 | Dean et al. |
| 2006/0237838 A1 | 10/2006 | Fery et al. |
| 2007/0039817 A1 | 2/2007 | Daniels et al. |
| 2007/0138442 A1 | 6/2007 | Weiser et al. |
| 2007/0164424 A1 | 7/2007 | Dean et al. |
| 2007/0166554 A1 | 7/2007 | Ruchert et al. |
| 2007/0241307 A1 | 10/2007 | Nguyen |
| 2008/0194888 A1 | 8/2008 | Merkel et al. |
| 2008/0207788 A1 | 8/2008 | Bowman et al. |
| 2009/0020192 A1 | 1/2009 | Segal et al. |
| 2009/0270661 A1 | 10/2009 | Wang et al. |

FOREIGN PATENT DOCUMENTS

| | | |
|---|---|---|
| EP | 1449935 | 8/2004 |
| EP | 1584706 | 10/2005 |
| JP | 63227775 | 9/1988 |
| JP | 63244727 | 10/1988 |
| JP | 2006081142 | 3/1994 |
| JP | 09268367 | 10/1997 |
| JP | 11335826 | 12/1999 |
| JP | 2000096219 A | 4/2000 |
| JP | 2000096221 A | 4/2000 |
| JP | 2000-265265 * | 9/2000 |
| JP | 2001-262330 | 9/2001 |
| JP | 2001-316810 A | 11/2001 |
| JP | 2002-363641 | 12/2002 |
| JP | 2003504513 A | 2/2003 |
| JP | 2003-342720 | 12/2003 |
| JP | 2005-015824 | 1/2005 |
| JP | 2005-2000682 A | 7/2005 |
| WO | WO 98/41669 | 9/1998 |
| WO | WO 01/94660 | 12/2001 |
| WO | 03/000950 A1 | 1/2003 |
| WO | 2004/024979 A1 | 3/2004 |
| WO | WO 2004/064114 | 7/2004 |
| WO | WO 2004/111295 A | 12/2004 |
| WO | WO 2005/021828 | 3/2005 |
| WO | WO 2007/002703 | 1/2007 |

OTHER PUBLICATIONS

Callister, William D. Jr., "Materials Science and Engineering: An Introduction", 3rd edition, John Wiley and Sons, Inc. (1994), pp. 349-350.

(56) References Cited

OTHER PUBLICATIONS

Chen, Dyi-Cheng, "A Finite Element Investigation into the Changing Channel Angular Extrusion of Brass Alloy", Materials Science Forum vol. 594 (2008) pp. 90-95.

Chen, Haihong et al., "Grain Refinement and Texture Evolution during equal Channel Angular Etrusion of Pure Cu and Cu-Zn Alloys", Materials Science Forum vols. 654-656 (2010) pp. 1215-1218.

Ferrasse et al., "Microstructure and Properties of Copper and Aluminum Alloy 3003 Heavily Worked by Equal Channel Angular Extrusion", Metallurgical and Materials Transactions A, vol. 28A, Apr. 1997, pp. 1047-1057.

Ferrasse, S. et al., "Texture evolution during equal channel angular extrusion Part 1. Effect of route, number of passes and initial texture", Materials Science and Engineering, vol. 368, Mar. 15, 2004, pp. 28-40.

Ferrasse, S. et al., ECAE Targets with Sub-Micron Grain Structures Improve Sputtering Performance and Cost-of-Ownership, © Honeywell International Inc., 8 pages.

Furukawa, M. et al., "Microhardness Measurements and the Hall-Petch Relationship in an Al-Mg Alloy with Submicrometer Grain Size", Acta Mater. vol. 44, No. 11, pp. 4619-4629, 1996.

Humphreys, F. J. et al., "Developing stable fine-grain microstructures by large strain deformation", Phil. Trans. R. Soc. Lond. A, Jun. 15, 1999, vol. 357 #1756, pp. 1663-1681.

International Search Report and Written Opinion issued in PCT/US2007/067763, mailed May 27, 2008.

Iwahashi, Yoshinori et al., Microstructural Characteristics of Ultrafine-Grained Aluminum Produced Using Equal-Channel Angular Pressing, Metallurgical and Materials Transactions, vol. 29A, pp. 2245-2252, Sep. 1998.

Segal et al., "Plastic Working of Metals by Simple Shear", Russian Metall. vol. 1, pp. 99-105, 1991 (with English Translation).

Segal, V. M., "Equal channel angular extrusion: from macromechanics to structure formation", Materials Science & Engineering A271, Nov. 1, 1999, pp. 322-333.

Segal, V.M., "Materials processing by simple shear", Materials Science and Engineering, A 197, 1995, pp. 157-164.

Valiev, R.Z. et al., "Bulk Nanostructured materials from severe plastic deformation", Progress in Materials Science, vol. 45, 2000, pp. 103-189.

Valiev, R.Z. et al., "Plastic deformation of alloys with submicron-grained structure", Materials Science and Engineering, A137 (1991) pp. 35-40.

Valiev, Ruslan Z. et al., "SPD—Processed Ultra-Fine Grained Ti Materials for Medical Applications", Advanced Materials & Processes, Dec. 2003, pp. 33-34.

* cited by examiner

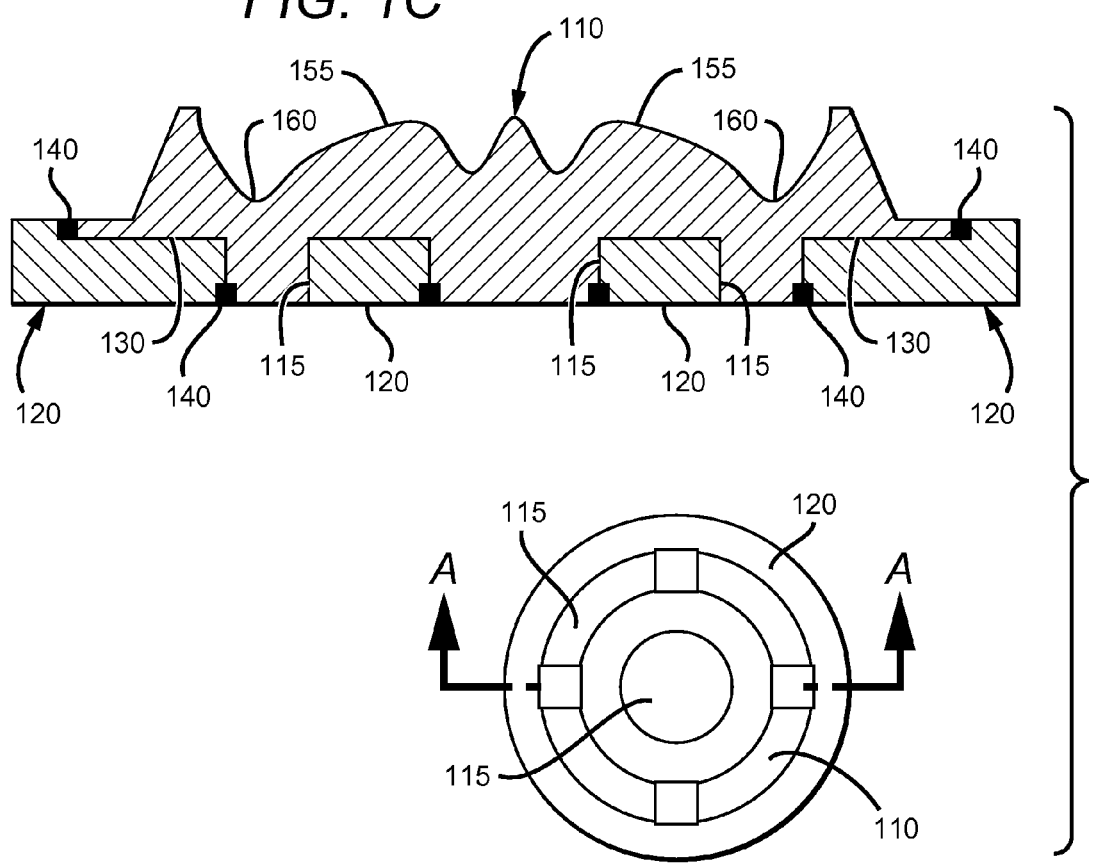
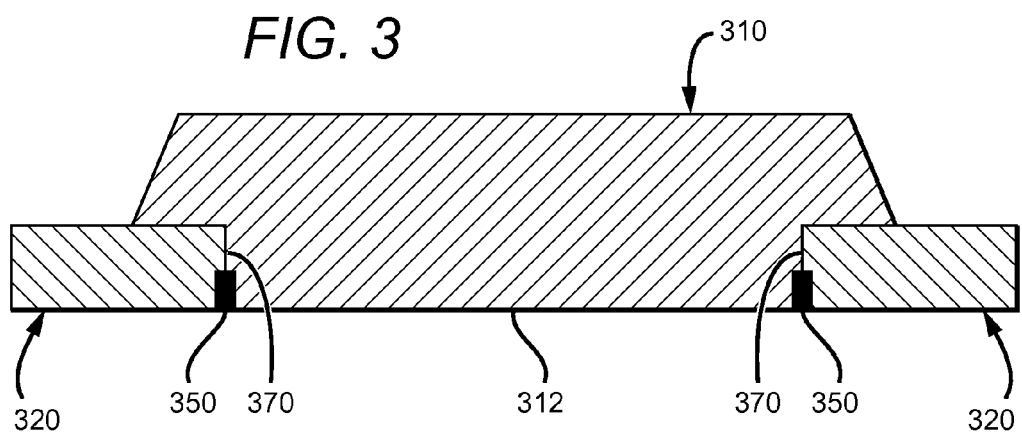

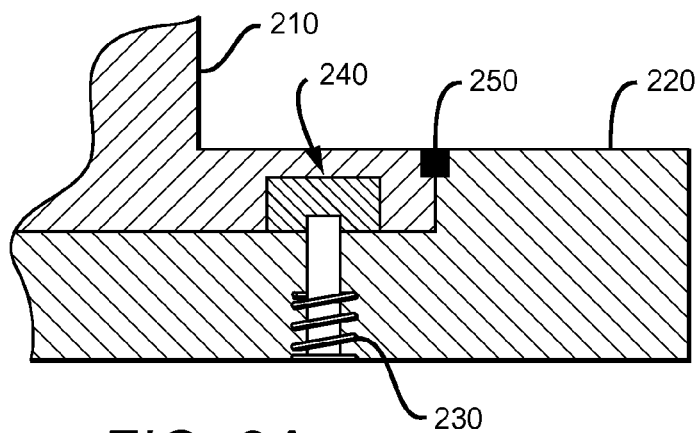
FIG. 2A
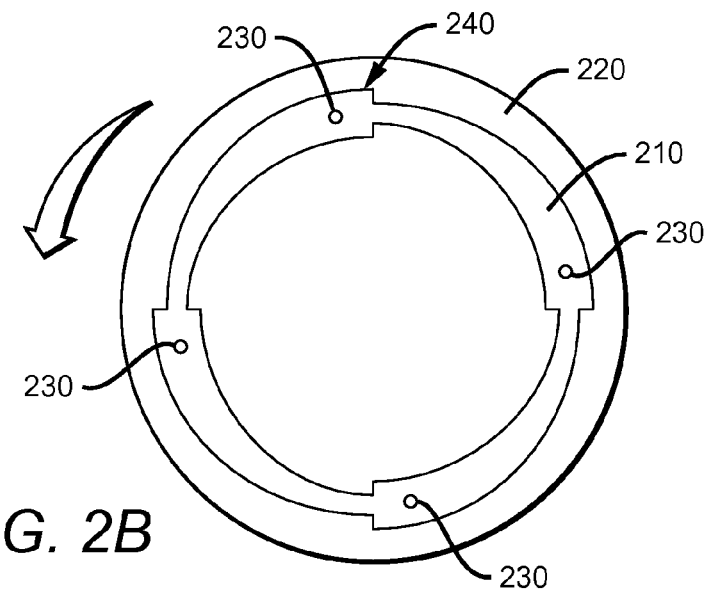
FIG. 2B
FIG. 2C
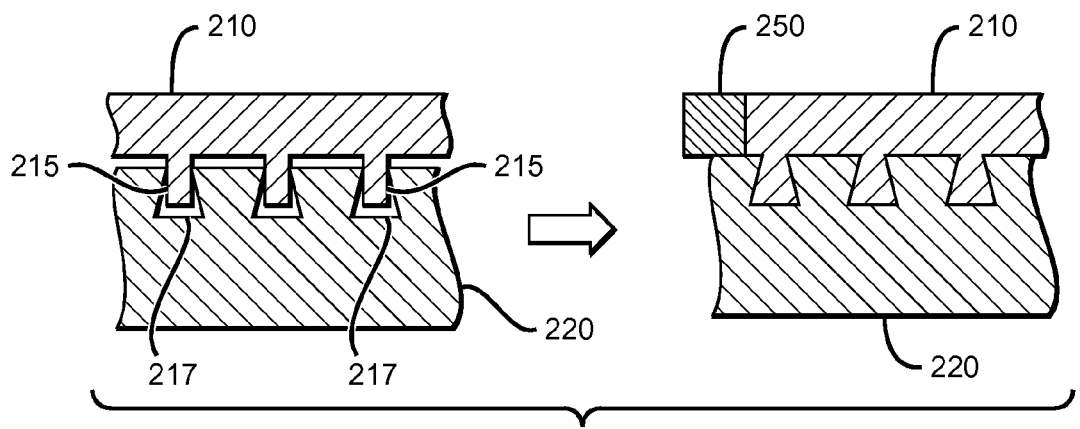

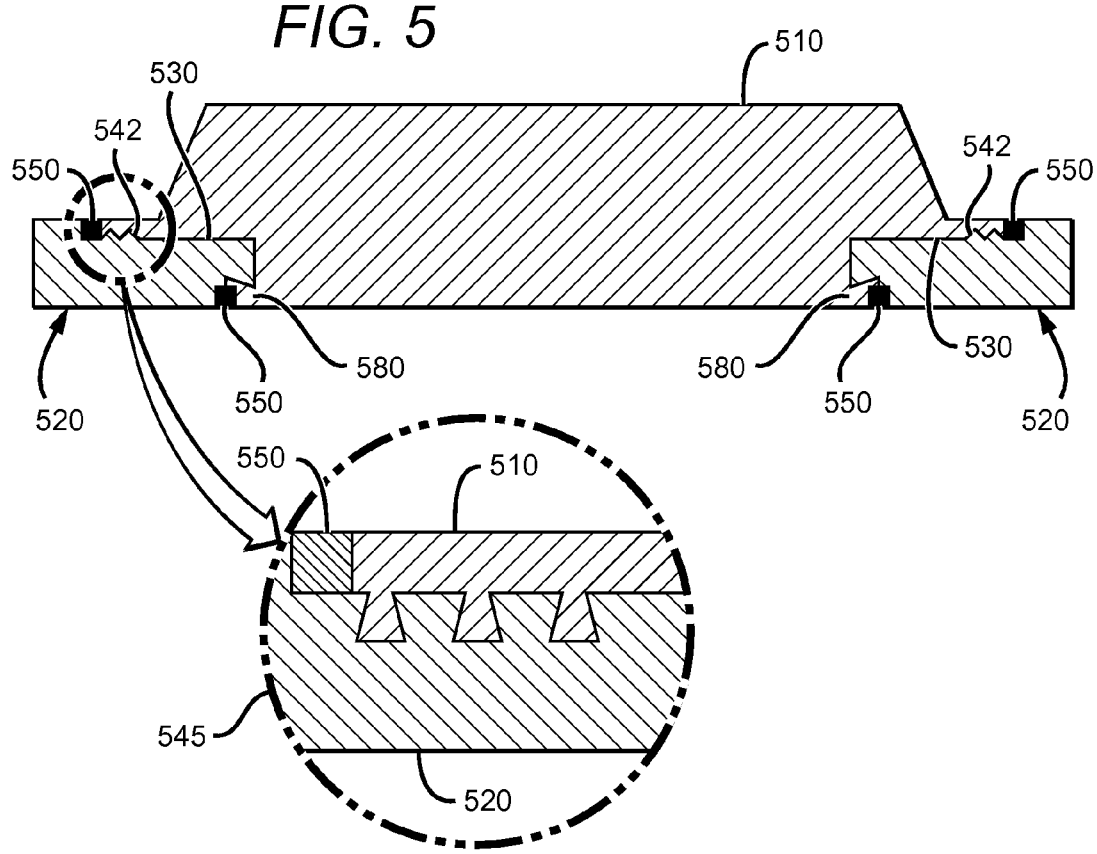
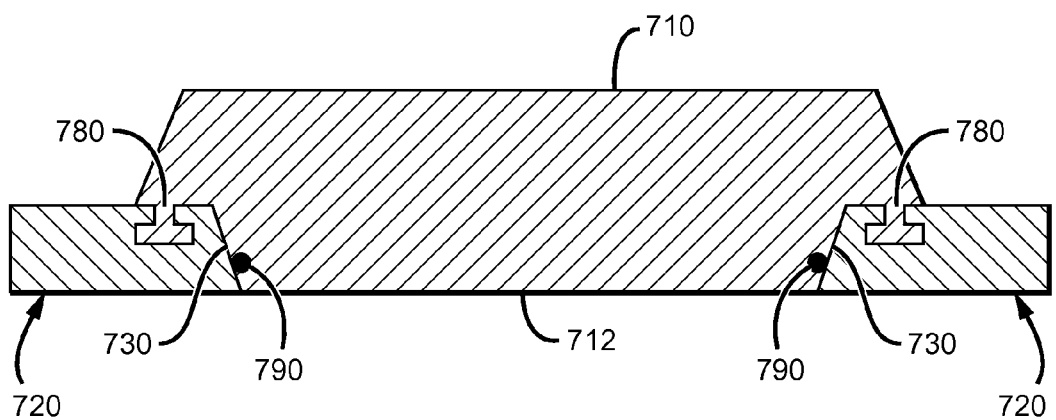

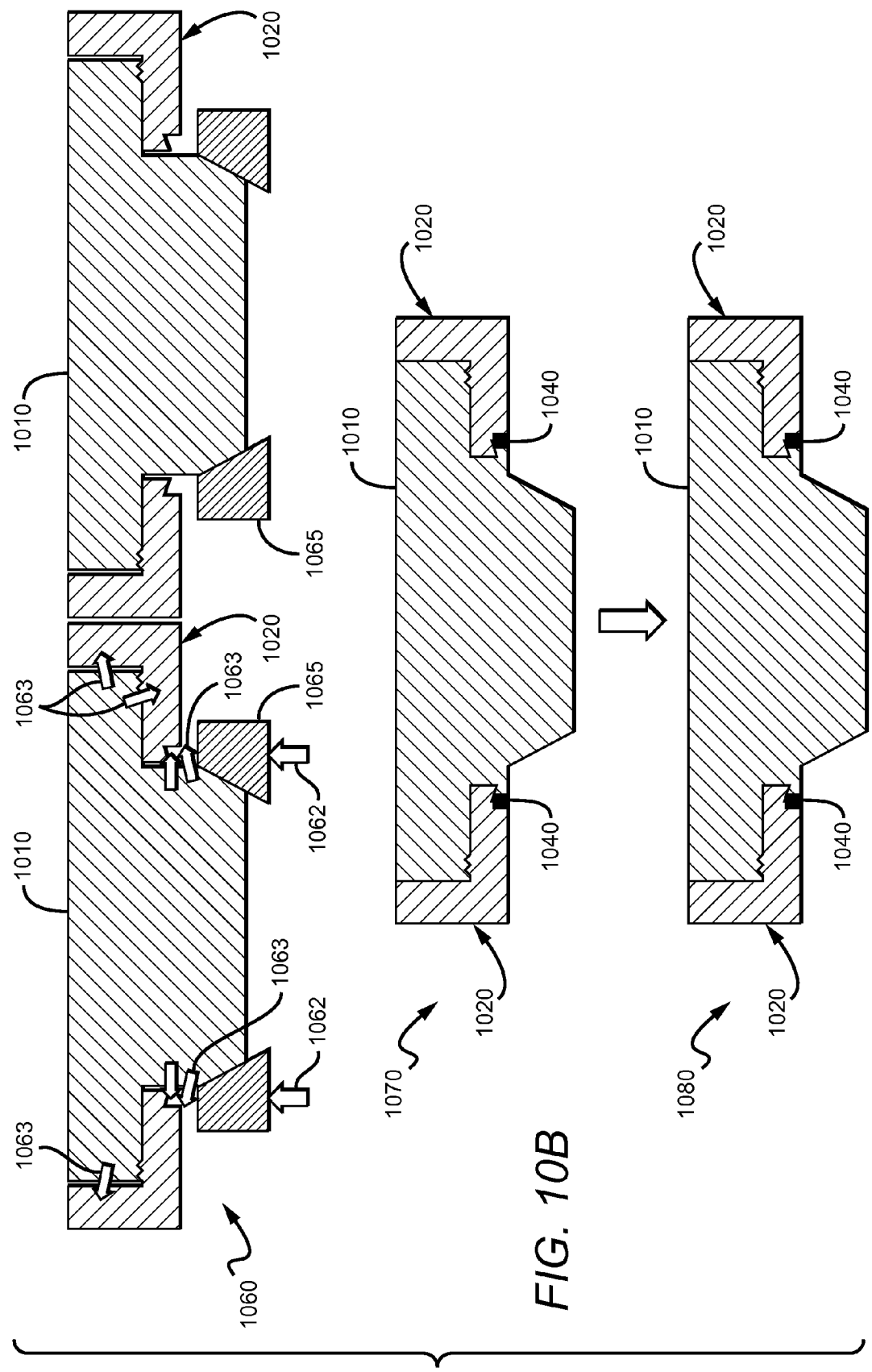

TARGET DESIGNS AND RELATED METHODS FOR COUPLED TARGET ASSEMBLIES, METHODS OF PRODUCTION AND USES THEREOF

FIELD OF THE SUBJECT MATTER

The field of the subject matter is design and use of sputtering targets that are coupled, which includes welded and/or mechanically joined, and also have a high strength core material.

BACKGROUND OF THE SUBJECT MATTER

Electronic and semiconductor components are used in ever-increasing numbers of consumer and commercial electronic products, communications products and data-exchange products. Examples of some of these consumer and commercial products are televisions, computers, cell phones, pagers, palm-type or handheld organizers, portable radios, car stereos, or remote controls. As the demand for these consumer and commercial electronics increases, there is also a demand for those same products to become smaller and more portable for the consumers and businesses.

As a result of the size decrease in these products, the components that comprise the products must also become smaller and/or thinner. Examples of some of those components that need to be reduced in size or scaled down are microelectronic chip interconnections, semiconductor chip components, resistors, capacitors, printed circuit or wiring boards, wiring, keyboards, touch pads, and chip packaging.

When electronic and semiconductor components are reduced in size or scaled down, killer defect sizes are significantly reduced per the required critical dimensions of the device. Thus, the defects that are present or could be present in the larger component should be identified and corrected, if possible, before the component is scaled down for the smaller electronic products.

In order to identify critical defects in electronic, semiconductor and communications components, the components, the materials used and the manufacturing processes for making those components should be broken down and analyzed. Electronic, semiconductor and communication/data-exchange components are composed, in some cases, of layers of materials, such as metals, metal alloys, ceramics, inorganic materials, polymers, or organometallic materials. The layers of materials are often thin (on the order of less than a few tens of angstroms in thickness). In order to improve on the quality of the layers of materials, the process of forming the layer—such as physical vapor deposition of a metal or other compound—should be evaluated and, if possible, modified and improved.

In order to improve the process of depositing a layer of material, the surface and/or material composition must be measured, quantified and defects or imperfections detected. In the case of the deposition of a layer or layers of material, its not only the actual layer or layers of material that should be monitored but also the material and surface of that material that is being used to produce the layer of material on a substrate or other surface that should be monitored. For example, when depositing a layer of metal onto a surface or substrate by sputtering a target comprising that metal, the target must be monitored for uneven wear, target deformation, target deflection and other related conditions. Uneven wear of a sputtering target is inevitable, a function of the magnet design and will reduce the lifetime of the target, and in some cases result in little or no deposition, of the metal on the surface of a substrate.

In conventional flat design sputtering targets (for example, targets used in the ALPS® sputtering chamber and/or the ENDURA® PVD system for 300 mm wafers, which are herein referred to generally as 300 mm ALPS or 300 mm ENDURA), there are three main types—each with advantages and disadvantages. For the first type, the target and backing plate are solder-bonded, with epoxy, indium and/or tin used for bonding. Soldering is a low cost, easy and low temperature operation, which preserves structure, but it has the disadvantage of a low bond strength for high chamber power. The second type has a diffusion bonded target/backing plate assembly where there is diffusion bonding along the entire target/backing plate interface (by hipping, forging, explosion bonding, etc). Diffusion bonding provides a strong bond, but the diffusion bonding process involves high temperature which destroys or significantly affects the ultrafine or submicron structure of the target, such as that obtained by ECAE. Also excessive warping, debonding or cracking is observed during the cooling phase of diffusion bonding in target and backing plate materials with incompatible CTEs (ceramic materials, chalcogenides, W to CuZn, thin blanks with high uniformity requirements such as Ni and Co). In the third type, a monolithic target is produced, which is relatively easy to manufacture, but requires strong, high purity material, that depends on the grain size, composition or both. Especially, in materials such as high purity aluminum and aluminum alloys, grain size needs to be less than 1 micron to provide enough strength for the use of a monolithic design. In that case grain refinement is obtained by severe plastic deformation using techniques such as Equal Channel Angular Extrusion (ECAE). Honeywell owned U.S. Pat. Nos. 5,590,389, 5,780,755, 6,723,187 or 6,908,517 describe the use of ECAE to produce sputtering targets with submicron or ultrafine grain sizes. For some extreme sputtering applications (high power, high water pressure), the monolithic target strength can be significantly tested, in particular in the flange area, which is the thinnest area.

Problems will occur when the sputtering target overheats because of the bombardment of the target with argon ions at a high power, which can often exceed a few to several tens of kilo-Watts. Such a high power can significantly affect the surface temperature of the PVD target without proper cooling and/or degrade the mechanical stability of the target if the cooling is inefficient. As mentioned, problems develop when using targets (especially aluminum and aluminum alloys) having very fine structures for high power sputtering applications. In monolithic designs, where a high strength submicron structure is needed, the submicron structure can lose some of its mechanical properties, because of the higher target temperatures leading to unacceptable warping. For diffusion or solder-bonded target designs, the higher temperatures/power creates excessive warping and potentially "debonding", because of mismatch in the coefficient of thermal expansion between the target and backing plate material and degradation of mechanical properties of the backing plate materials. Diffusion and solder-bonding cannot provide targets with very fine grain sizes (less than 20 microns, for example, of a high purity aluminum PVD target), because heating treatments necessary to get a strong bond involve sufficiently high temperatures and cause the grain size to grow. There are four generally accepted factors that control the cooling of a sputtering target: a) thermal conductivity, b) cooling water flow rate, c) cooling surface area and d) the thickness of a target.

Cooling of the sputtering target can be improved by using a backing plate with a high thermal conductivity, increasing the cooling surface area, controlling the flow pattern of the coolant, improving coolant circulation with the rotating magnets and/or reducing the thickness of the target material. In the past, various attempts have been made to improve the cooling efficiency via various design modifications, but the most important "thickness factor" has not been considered for heat reduction. Therefore, in order to maximize the mechanical stability of sputtering targets while at the same time maximizing sputtering performance, researchers and technicians should review the cooling efficiency of the sputtering target.

Gardell et al. (U.S. Pat. No. 5,628,889) discloses a high-power capacity magnetron cathode with an independent cooling system for the magnet array support plate. In Gardell, a horizontal magnet array fluid control surface is physically attached to the magnet array support plate. The fluid control surface or device is not integrated into the materials of the support plate, the magnet array or the cathode materials. Therefore, there are more working parts, additional layers of complexity in the design and use of the magnetron cathode, and additional work for workers who handle repair and replacement of parts.

To this end, it would be desirable to develop and utilize a target assembly design that is: a) cost-efficient, b) easy to control, c) manufactured utilizing a method that provides good bond strength, such as a low temperature joining, coupling or bonding method, while the production of the target assembly d) does not degrade the microstructure of target and maintain the thermal/mechanical properties of target assembly.

SUMMARY OF THE INVENTION

A sputtering target is described herein that comprises: a) a target surface component comprising a target material; b) a core backing component having a coupling surface, a back surface and at least one opening or open area, wherein the coupling surface is coupled to at least part of the target surface component; and wherein at least part of the target surface component fits into at least one opening or open area of the core backing component.

Methods of forming a sputtering target are also described that comprises: a) providing a target surface component comprising a surface material; b) providing a core backing component having a coupling surface, a back surface and at least one open area; c) coupling the coupling surface to at least part of the target surface component, wherein at least part of the target surface component fits into the at least one open area of the core backing component.

BRIEF DESCRIPTION OF THE FIGURES

FIG. 1C shows a contemplated target having several openings 115 that correspond to the deepest erosion groove 160.

FIG. 2A shows the side view of a contemplated core backing component 220 where the vertical lock pin 230 is inserted after the wedge design feature is tightened.

FIG. 2B shows the bottom side of a contemplated core backing component 220, wherein the component comprises two mechanical reinforcements—a wedge design 240 that is designed to tighten the coupling between the core backing component 220 and the target surface material 210 with rotation, and vertical lock pins 230 that are designed to fix the end of rotation of the annular core backing component 220 and lock it in place with respect to the target surface component 210.

FIG. 2C shows a "forge reinforcement" of the weld where the core backing component 220 and target surface component 210 have interlocking or "male/female" coupling points 215 and 217 located near the part to be welded.

FIG. 3 shows how a contemplated core backing component 320 and the target surface component 310 can be coupled by utilizing a threaded interface 370 between the two as a mechanical reinforcement

FIG. 5 shows a contemplated combination target assembly.
FIG. 7 shows a contemplated combination target assembly.

FIG. 10B shows a manufacturing process for producing a near net shape ring with a key-like connector on top of the flange (instead of the bottom as in FIGS. 8 and 9).

DETAILED DESCRIPTION

Figure 1A:
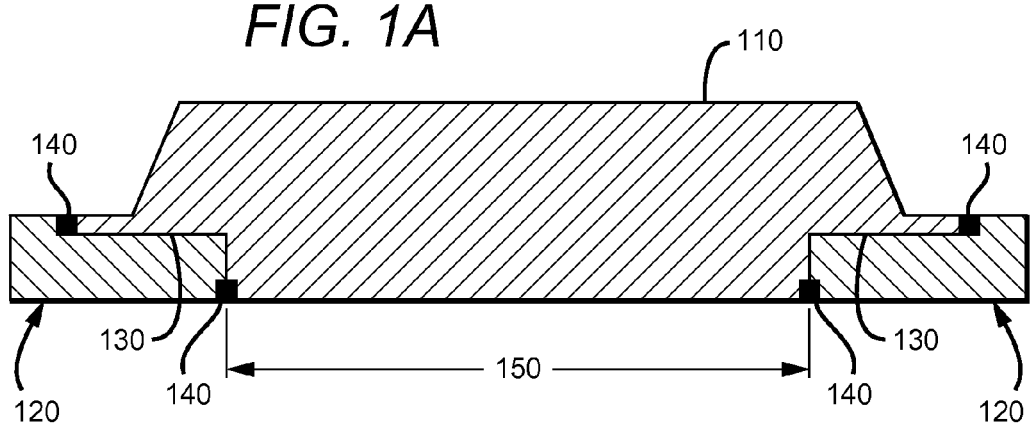
FIG. 1A shows a contemplated embodiment having an annular core backing component coupled to a target surface component.

A sputtering target and related cooling system has been developed and is described herein that is: a) cost-efficient, b) easy to control, c) manufactured utilizing a method that provides good bond strength, such as a low temperature joining or coupling method, while at the same time the production of the target assembly d) does not degrade the microstructure of target and maintains the thermal/mechanical properties of target assembly. In particular, design and joining/bonding techniques contemplated herein can be used to attach an ultrafine or submicron target material processed by ECAE to a high strength backing plate (ex. Al 2024, Al 6061, CuCr, Cu 18000) to provide a high strength target assembly for high power applications. Contemplated embodiments also include other methods to realize ultrafine or submicron target materials, such as for example cryorolling, cryoforging, torsion, cyclic extrusion, accumulated roll bonding, 3D forging, twist extrusion, flowforming or friction welding. Other contemplated materials are those having a large CTE mismatch with standard backing plate material (ex: Al 2024, Al 6061, CuCr, Cu 18000) and low ductility. Examples include refractory materials such as W, Ti—W, Ru, Ta, as well as chalcogenides. Most of those materials are in the form of powders.

Contemplated targets are manufactured by keeping the application of heat in the formation and joining or coupling process at a minimum, localized or both, in order not to affect the ECAE or standard microstructure (at least in the sputtered area). Heat is kept at a minimum by using preferentially a joining method providing a mechanical attachment with or without perfect contact between coupled surfaces. Heat localization is preferentially achieved by using welding techniques. Contemplated targets also are produced through a high strength target assembly process for target temperatures reached during high power sputtering. In particular, these targets provide a low in situ deflection (less than 3.25 mm at 2000 kWhrs at 35 kW for 300 mm Al0.5Cu ALPS, which is similar to 300 mm Al0.5Cu Endura, but at the higher power); and a low target permanent deflection (1.8 to 2.3 mm at 2000 kWhrs at 35 kW for 300 mm Al0.5Cu ALPS, which is also similar to 300 mm Al0.5Cu Endura, but at the higher power). Also, contemplated targets exhibit good thermal and electrical conductivity with no hot spots, which for ECAE Al0.5Cu ALPS, the temperature may be less than about 165° C. Other target configurations of interest are 200 mm and 300 mm ECAE Cu and Cu alloy Encore, Encore II and SIP targets and ECAE pure or doped Al target for flat panel displays where the target temperature should be less than about 250° C. Superior cooling is achieved by providing a design where at least one area of the target backside is directly in contact with the cooling fluids.

To this end, sputtering targets are described that comprise: a) a target surface component comprising a target material; b) a core backing component having a coupling surface, a back surface and at least one open area, wherein the coupling surface is coupled to at least part of the target surface component; and wherein at least part of the target surface component fits into at least one open area of the core backing component. In some embodiments, the target surface component, the core backing component or a combination thereof have at least one surface area feature coupled to or located in the back surface of the core backing component, the target surface component or a combination thereof, wherein the surface area feature increases the cooling effectiveness of the target surface component. In some embodiments, the core backing component is annular and has a coupling surface, a back surface and an open center area, wherein the coupling surface is coupled to at least part of the target surface component; and wherein at least part of the target surface component fits into the open center area of the core backing component.

Methods of forming a sputtering target are also described that comprises: a) providing a target surface component comprising a surface material; b) providing a core backing component having a coupling surface, a back surface and at least one open area; c) coupling the coupling surface to at least part of the target surface component, wherein at least part of the target surface component fits into the at least one open area of the core backing component.

Methods of forming a sputtering target are also described that comprises: a) providing a target surface component comprising a surface material; b) providing a core backing component having a coupling surface, a back surface and at least one open area; c) coupling the coupling surface to at least part of the target surface component, wherein at least part of the target surface component fits into the at least one open area of the core backing component, and d) providing at least one surface area feature coupled to or located in the back surface of the core backing component, the target surface component or a combination thereof, wherein the at least one surface area feature increases the cooling efficiency of the core backing component.

Sputtering targets and sputtering target assemblies contemplated herein comprise any suitable shape and size depending on the application and instrumentation used in the PVD process. Sputtering targets contemplated herein also comprise a target surface component and a core backing component comprising at least one opening or open area (wherein the backing component can include a backing plate), wherein the target surface component is coupled to a core backing component comprising at least one opening or open area through and/or around a PVD chamber. As used herein, the term "coupled" means a mechanical attachment with or without gaps between two parts of matter or components, physical attachment of two parts of matter or components (adhesive, attachment interfacing material) or a physical and/or chemical attraction between two parts of matter or components through the welding and/or mechanical joining processes. As mentioned, the term "coupled" may mean that there is a bond force or adhesive force between the constituents of the sputtering target and/or sputtering target assembly, such that the sputtering target and/or sputtering target assembly is comparable to the monolithic design. Alternatively, the coupling surface between the target and core backing component may not form a perfect interface (such as in a bonded interface where joining happens at the atomic level) and can comprise gaps. Gaps offer functional advantages. In particular, it was discovered that by allowing some gap at the interface between the target and core backing component, a target has room to expand laterally when heated during sputtering, which results in less vertical deflection. Optimally, heating during sputtering fills the initial gaps at the interface.

The target surface component is that portion of the target that is exposed to the energy source at any measurable point in time and is also that part of the overall target material, which is intended to produce atoms and/or molecules that are desirable as a surface coating. The target surface material comprises a front side surface and a back side surface. The front side surface is that surface that is exposed to the energy source and is that part of the overall target material that is intended to produce atoms and/or molecules that are desirable as a surface coating. The back side surface or back surface is that surface that a) passes through the at least one opening or open area of the core backing component, b) couples with the core backing component, or c) a combination thereof. The target surface component comprises a target material and that material may be any material that is suitable for forming a sputtering target. In some embodiments, the target surface component comprises a three-dimensional target surface, such as a target surface that is concave, convex or has some other unconventional shape. It should be understood that the target surface component, no matter what the shape of the component is, is the portion of the target that is exposed to the energy source at any measurable point in time and is also that part of the overall target material that is intended to produce atoms and/or molecules that are desirable as a surface coating.

The core backing component with at least one opening or open area comprises any suitable backing or core material, and is designed to reinforce the flange area which is the thinnest part of a target, provide support for the target surface component and material and limit the warping of target. The core material is preferentially stronger than the target material, which is the primary factor for flange reinforcement.

The core backing component with at least one opening or open area comprises a coupling surface that is designed to couple to at least part of the back and/or side surfaces of the target surface component. Contemplated core backing components also comprise a back surface that is designed to form at least part of the back of the sputtering target assembly, wherein the sputtering target assembly comprises a target surface component and a core backing component. In addition, contemplated core backing plates also comprise at least one opening that is designed to receive the target surface in a "male/female" design. Openings can have any shape, dimension or number. The number, shape and dimension of the opening are dictated by design considerations, especially needed strength and cooling efficiency. In some embodiments, only one central opening is used and as a result the core backing component is annular in shape. In some embodiments, the core backing component comprises a backing plate or backing plate materials.

In a contemplated embodiment, a core backing component is coupled to a target surface component, such as the embodiment shown in FIG. 1A. In this figure, the target surface component 110 comprises an ECAE target material, and the core backing component 120 comprises an annular opening, in this embodiment, and a high strength Al 2024 material. The target surface component and core backing component are coupled 130 and E-beam welded at suitable spots 140, such as those shown. The inside diameter of the core backing component is shown as 150. When this particular embodiment was modeled for an Al0.5Cu target material, it was discovered that the temperature of the target is less than 165° C., as long as the core backing component inner diameter is not too small. This embodiment also showed a similar in situ deflection to a monolithic design, which depends on gaps at the weld interface. These contemplated target assemblies can be strengthened by reinforcing the welds 140. Similarly modeling at a high sputtering power of 60 kW of a Cu target material with a CuCr annular core backing component reveals that, for optimal inside diameter 150, the temperature of the target is less than 210° C., which is close to that of a monolithic configuration (202° C.). In this embodiment, is it also possible to have a third material at the interface target surface component and core backing component for better thermal/electrical conductivity.

Figure 1B:
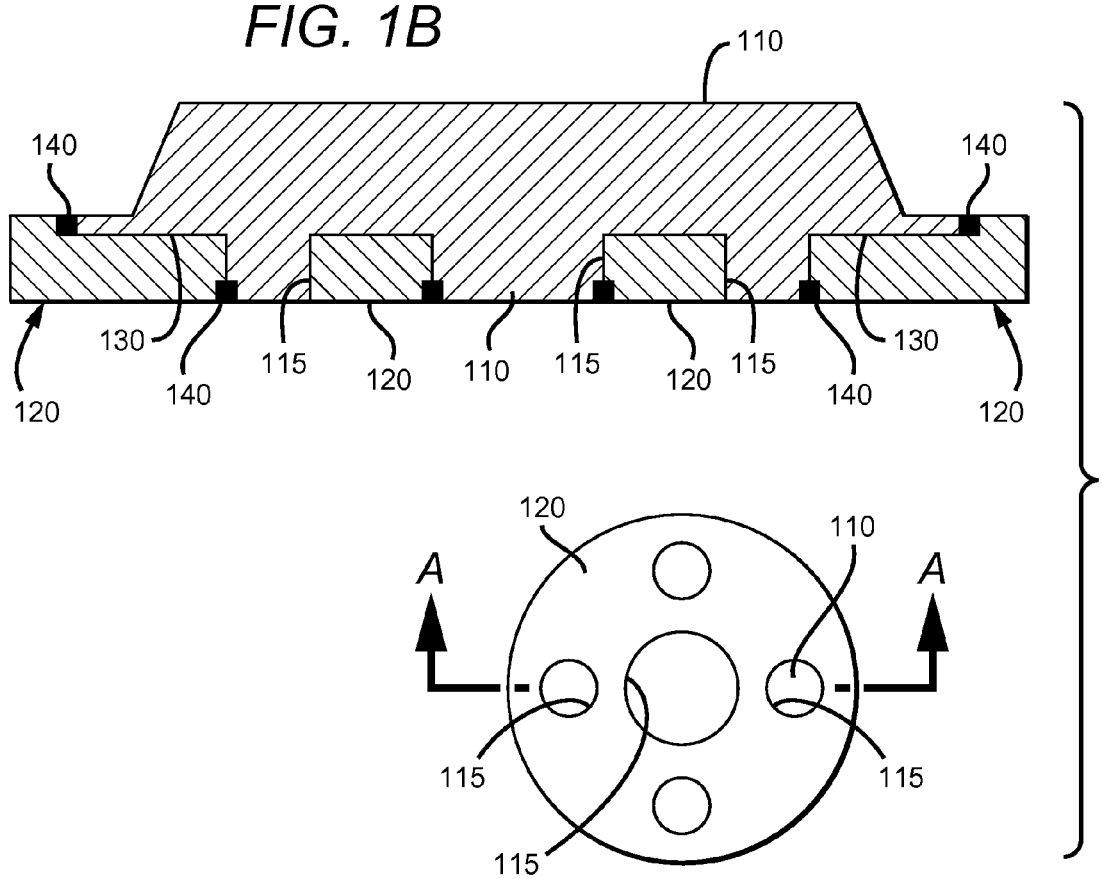
FIG. 1B shows a contemplated target having an underside and a side view of a target with a plurality of cylindrical openings 115—in this case, five cylindrical openings.

FIG. 1B shows a contemplated target having an underside and a side view of a target. The side view is representative of the target with a cut made through the target at the "A" to "A" position (see dotted lines). This contemplated target has a plurality of cylindrical openings 115—in this case, five cylindrical openings In this figure, the target surface component 110 may comprise any suitable target material, and the core backing component 120 comprises any suitable backing or core material. The target surface component and core backing component are coupled 130 and E-beam welded at suitable spots 140, such as those shown. Coupling 130 and E-beam welding are considered examples of coupling mechanisms. Having several openings is advantageous to strengthen the connection between the target material and the core backing component (backing plate). For maximum cooling efficiency, it may be advantageous to position the openings near the areas with the fastest sputtering rate (i.e. deepest erosion grooves) which are heated the most. FIG. 1C shows a contemplated target having an underside and a side view of a target. The side view is representative of the target with a cut made through the target at the "A" to "A" position (see dotted lines). This contemplated target has several openings 115 that correspond to the deepest erosion groove 160 on the general erosion pattern 155. In this figure, the target surface component 110 may comprise any suitable target material, and the core backing component 120 comprises any suitable backing material. The target surface component and core backing component are coupled 130 and E-beam welded at suitable spots 140, such as those shown. Weld points may also be produced by friction welding, diffusion welding, LASER welding or a combination thereof.

Weld, and ultimately sputtering target assembly, reinforcement is localized near the weld point at the interface between the target and core backing material and can be accomplished by several different methods, including use of filler material or brazing material, machine reinforcement, mechanical reinforcement, forge reinforcement or a combination thereof. FIGS. 2A and 2B show a machined reinforcement. FIG. 2A shows the side view of a contemplated annular core backing component 220 where the vertical lock pin 230 is inserted after the wedge design feature is tightened. It is instructive to note that the core backing component 220 and the target surface components 210 are also welded in this embodiment and the welds 250 are located near the wedge design feature 240. FIG. 2B shows the bottom side of a contemplated core backing component 220, wherein the component comprises two mechanical reinforcements—a wedge design 240 that is designed to tighten the coupling between the core backing component 220 and the target surface material 210 with rotation, and vertical lock pins 230 that are designed to fix the end of rotation of the core backing component 220 and lock it in place with respect to the target surface component 210. FIG. 2C shows a "forge reinforcement" where the core backing component 220 and target surface component 210 have interlocking or "male/female" coupling points 215 and 217 located near the part to be welded. Once the two components are coupled, the combination is "forge reinforced" to cause the target material and/or core backing material to flow and fill up the coupling points. The resulting coupled points reduce stresses in adjacent weld 250 and increase service life.

In another embodiment, a core backing component 320 and the target surface component 310 can be coupled by utilizing a coupling mechanism, such as a threaded interface 370 between the two as a mechanical reinforcement, which is shown in FIG. 3. Note that once the two components are coupled through mechanical reinforcement, the components are also welded in targeted locations 350 to strengthen the bond between the two components 310 and 320. The bottom center of the target 312 is designed in this embodiment to be in direct contact with a cooling fluid or source (not shown).

Figure 4A:
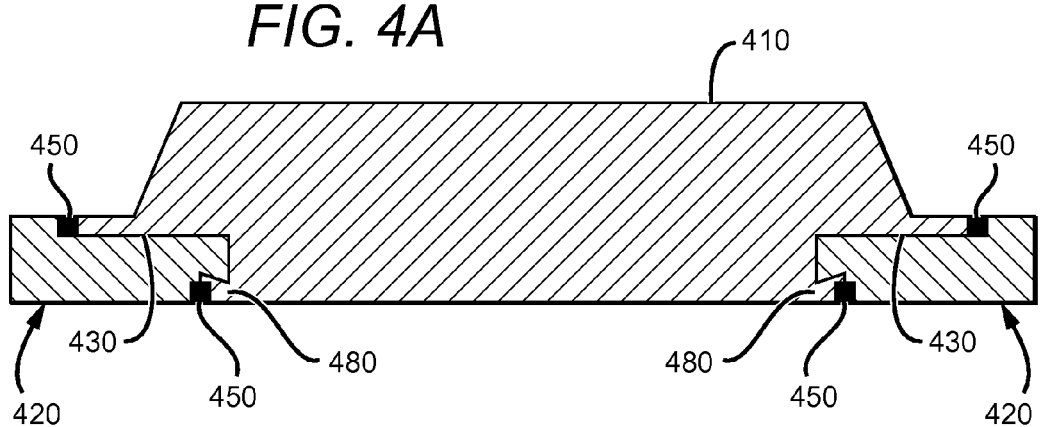
FIG. 4A shows another embodiment of contemplated target assembly designs. This core backing component 420 is coupled to the target surface component 410 through the use of a "rivet-like" or "key-like" fitting 480 between the two components 410 and 420.
Figure 4B:
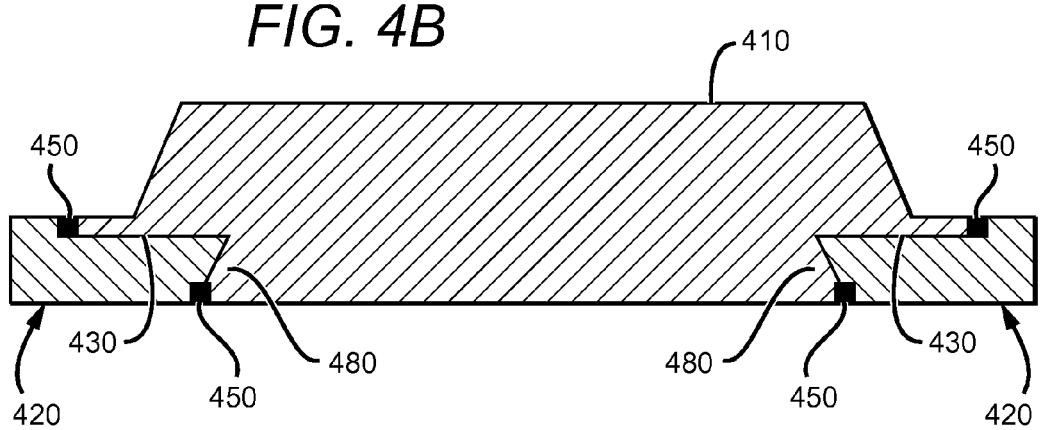
FIG. 4B shows another embodiment of contemplated target assembly designs. The core backing component 420 is coupled to the target surface component 410 through the use of a "rivet-like" or "key-like" fitting 480 between the two components 410 and 420.

FIGS. 4A and 4B, along with FIG. 5, show yet another embodiment of contemplated target assembly designs. The core backing component 420 is coupled to the target surface component 410 through the use of a "rivet-like" or "key-like" fitting 480 coupling mechanism between the two components 410 and 420. These key-like fittings 480 are matching grooves and/or recesses in each component that are specifically designed to couple the two components together. Two contemplated methods to form those "rivet-like" features are (i) machining and fitting by translation/rotation, and (ii) pressing at no or low temperature by conventional methods such as rolling, forging or torsion (so called "forge reinforcement"). With the machining method, gaps are usually present at the interface. Once the male/female portions of the "rivet-like" feature are machined, rotation or translation between the target and core backing component is used so that the male portion of the first component fits tightly in the female portion of the other component. With the forge reinforcement method, the coupling surface can contain gaps or be almost perfect (atomically joined) depending on the pressure, time and temperature used during the forge reinforcement step. Welding may be utilized at targeted spots 450 where the components 410 and 420 are coupled 430 in order to further secure the components 410 and 420.

Figure 6:
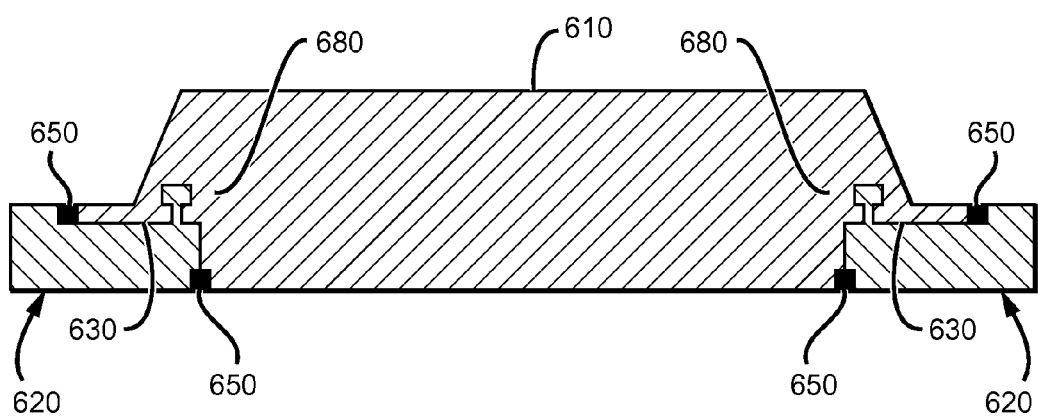
FIG. 6 shows a contemplated combination target assembly.

FIGS. 5-7 show contemplated combination target assemblies having a target surface component (510, 610 and 710, respectively) and a core backing component (520, 620 and 720, respectively) where a key-like mechanical coupling mechanism (580, 680 and 780, respectively) is combined with welding at targeted spots (550 and 650, respectively) where the target surface components and core backing components are coupled (530, 630 and 730, respectively) and in some embodiments like the one shown in FIG. 5, a potential weld reinforcement by forging, similar to that shown in FIG. 2C. The core backing component 520 is coupled to the target surface component 510 through the use of a "rivet-like" or "key-like" fitting 580 between the two components 510 and 520. In those cases, the target and core backing plate form a large rivet. These embodiments show the flexibility in combinations of coupling mechanisms. In FIG. 7, an optional O-ring 790 may be included. The bottom center of the target 712 is designed in this embodiment to be in direct contact with a cooling fluid or source (not shown). In FIG. 5, a blow-up 545 of the coupling mechanism point 542 is shown for illustrative purposes.

Figure 8:
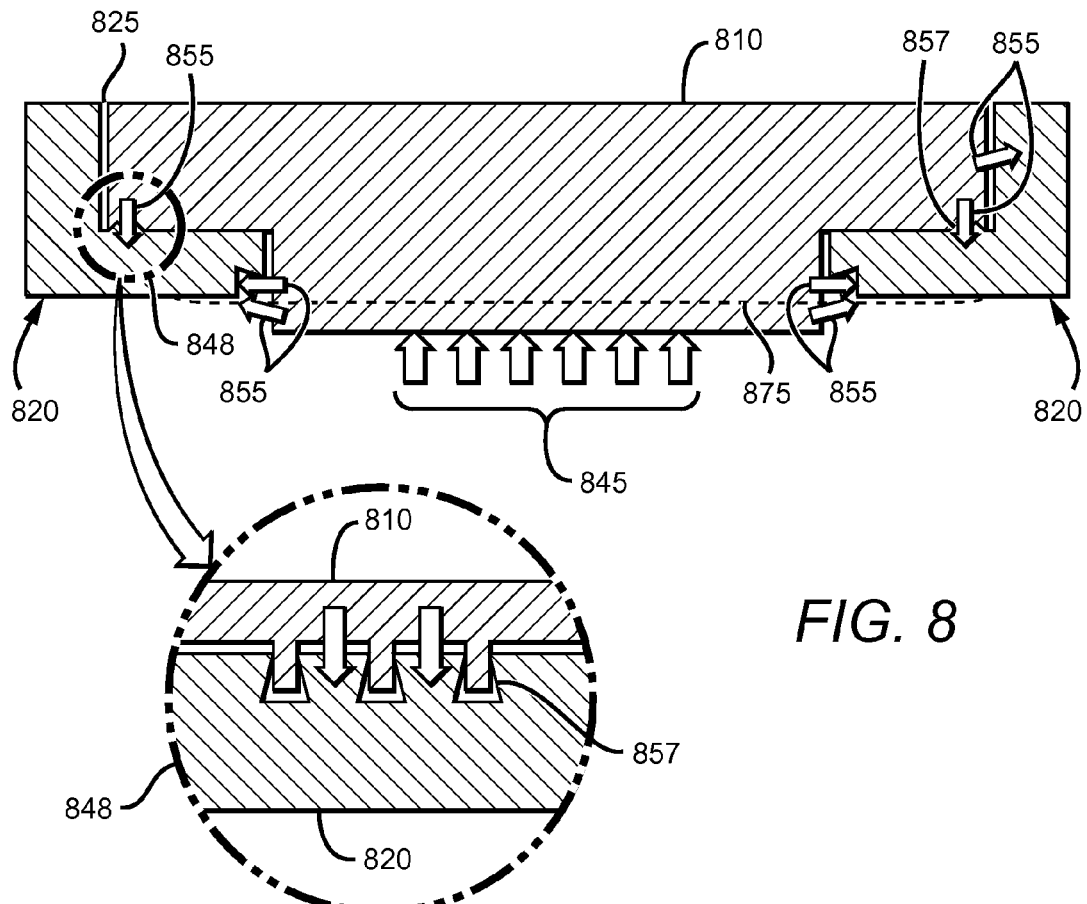
FIG. 8 shows a contemplated combination target assembly.
Figure 9:
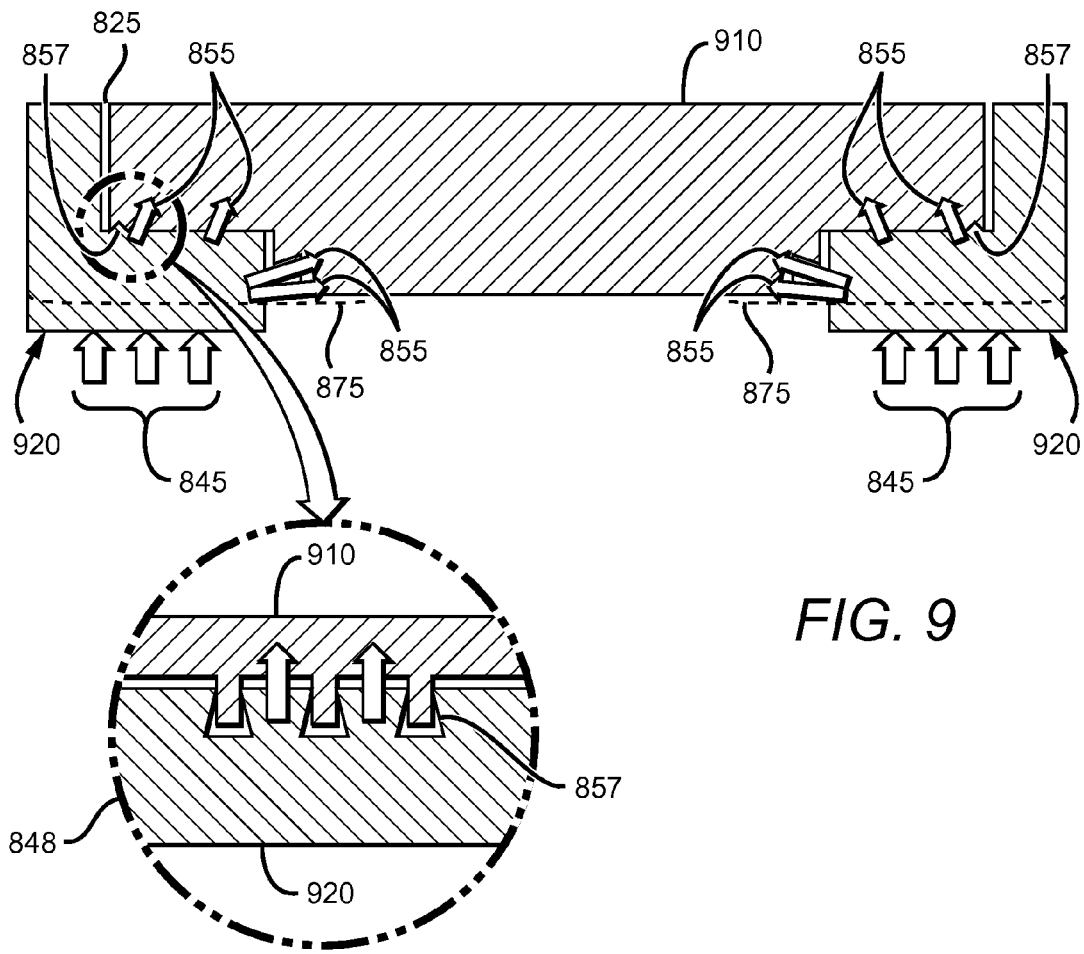
FIG. 9 shows a contemplated combination target assembly.

FIGS. 8 and 9 show how a contemplated core backing component (820 and 920, respectively) and the target surface component (810 and 910, respectively) might originally fit together before making a "key-like" or "rivet-like" feature by a forge reinforcement step. The core backing component 820 is coupled to the target surface material 810. The weld line is shown in the figures as 825. Pressure 845 is applied through a forging step on at least one point on the core backing component 820. Material flow 855 is accomplished on at least one contact point 857 between the core backing component 820 and the target surface material 810. Note that the forge reinforcement step is designed to fill in any gaps between the two components. The dotted line 875 in each figure is designed to show where the location of the surface is at the end of the forging step. The forge reinforcement step can be accomplished by any known method that exerts pressure such as rolling, forging or torsion. One single pressing step can form multiple rivet-like features through several openings (such as those shown in FIG. 1B). Conditions of temperature and time less than those causing the microstructure (grain size) of a target to grow and degrade may be used. Also, the material with the least strength should be the one to flow. For example, high purity Al alloy and Cu target material are softer than most common backing plate materials and may be pressed according to FIG. 8.

However, some materials such as chalcogenides, Ti—W, Ta, W or Ru are either too strong or not easy to deform at low temperatures (especially in the form of powders) and in that case it may be advantageous to have only the backing plate material flow, as indicated in FIG. 9. In the case of heat treatable backing plates (Al 2024), it is then desirable to perform the forge reinforcement in the non aged (non hardened) condition first and conduct a low temperature aging treatment only after the "rivet-like" feature is formed. The aging treatment provides then the backing plate with its maximum strength and does not alter the target microstructure or target grain size because aging is a low temperature treatment. It is also important to enhance the localized flow of material in the needed gaps before the tonnage becomes too high or the target material of the opposite face (which is to be sputtered) start to flow laterally thereby altering the microstructure.

Figure 10A:
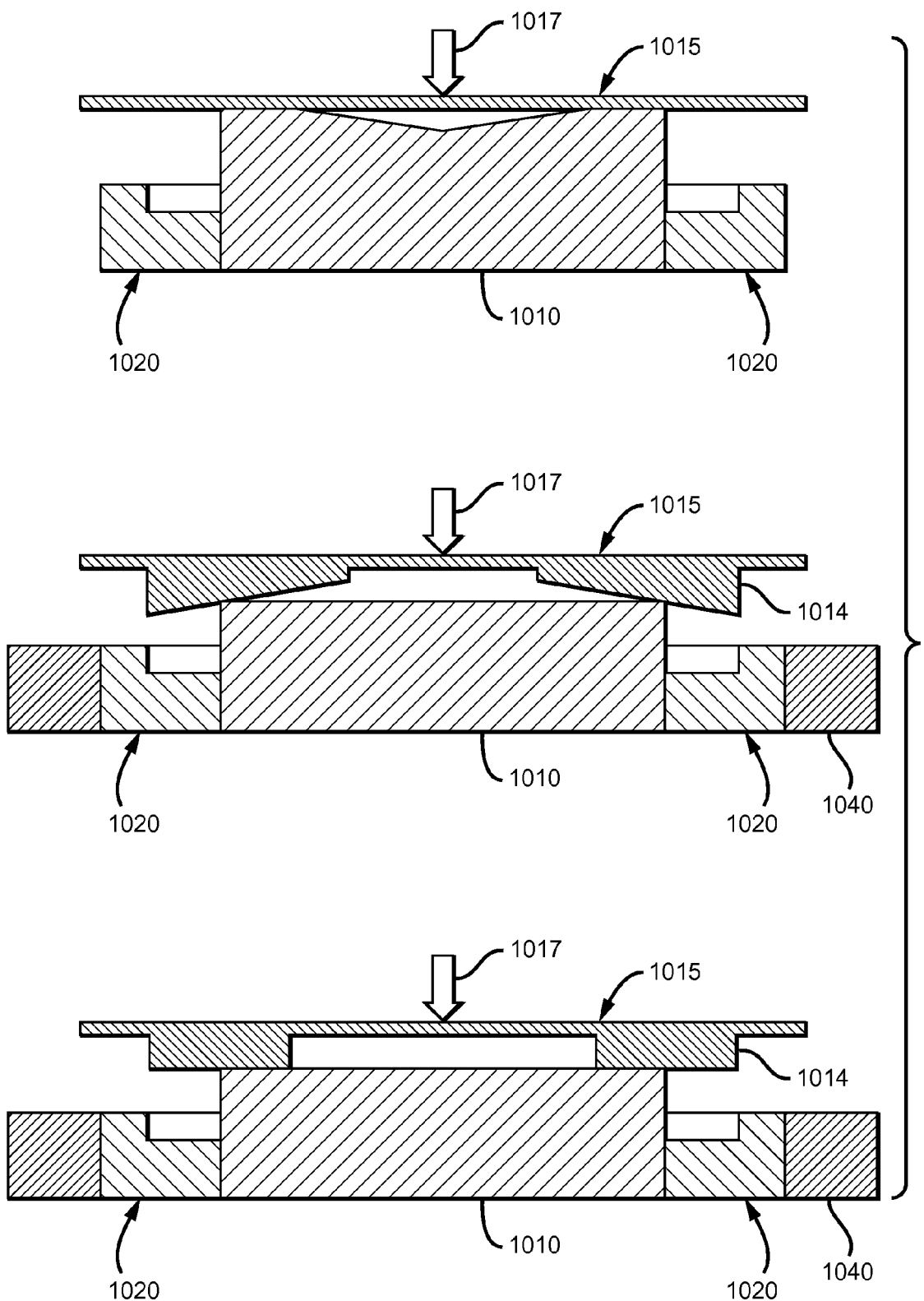
FIG. 10A shows a few strategies to facilitate the rivet formation when the target material is pressed.

FIG. 10A shows a few strategies to facilitate the rivet formation when the target material is pressed. In one case, the surface to be pressed is machined so that the contact between the pressing tool 1015 and target material 1010 occurs first on the outside edge near the gap to be filled. In another case, a ring 1014 with a flat or sloped surface is put in between the pressing tool 1015 and the target material 1010 and pushes mainly the target material 1010 located near the gaps to be filled. An external ring 1040 is also shown that limit the possible deformation of the core material component 1020 during the pressing operation 1017. FIG. 10B shows a manufacturing process for producing a near net shape ring with a key-like connector on top of the flange (instead of the bottom as in FIGS. 8 and 9). In step 1060, a forge rivet is formed by utilizing pressure 1062 causing material to flow 1063 and using a near net shape ring 1065. In step 1070, the welding—forming weld points 1040—and final machining are performed on the target material 1010. In step 1080, the final product—which is the combination of the target surface material 1010 and the core backing component 1020, is cleaned.

Figure 11:
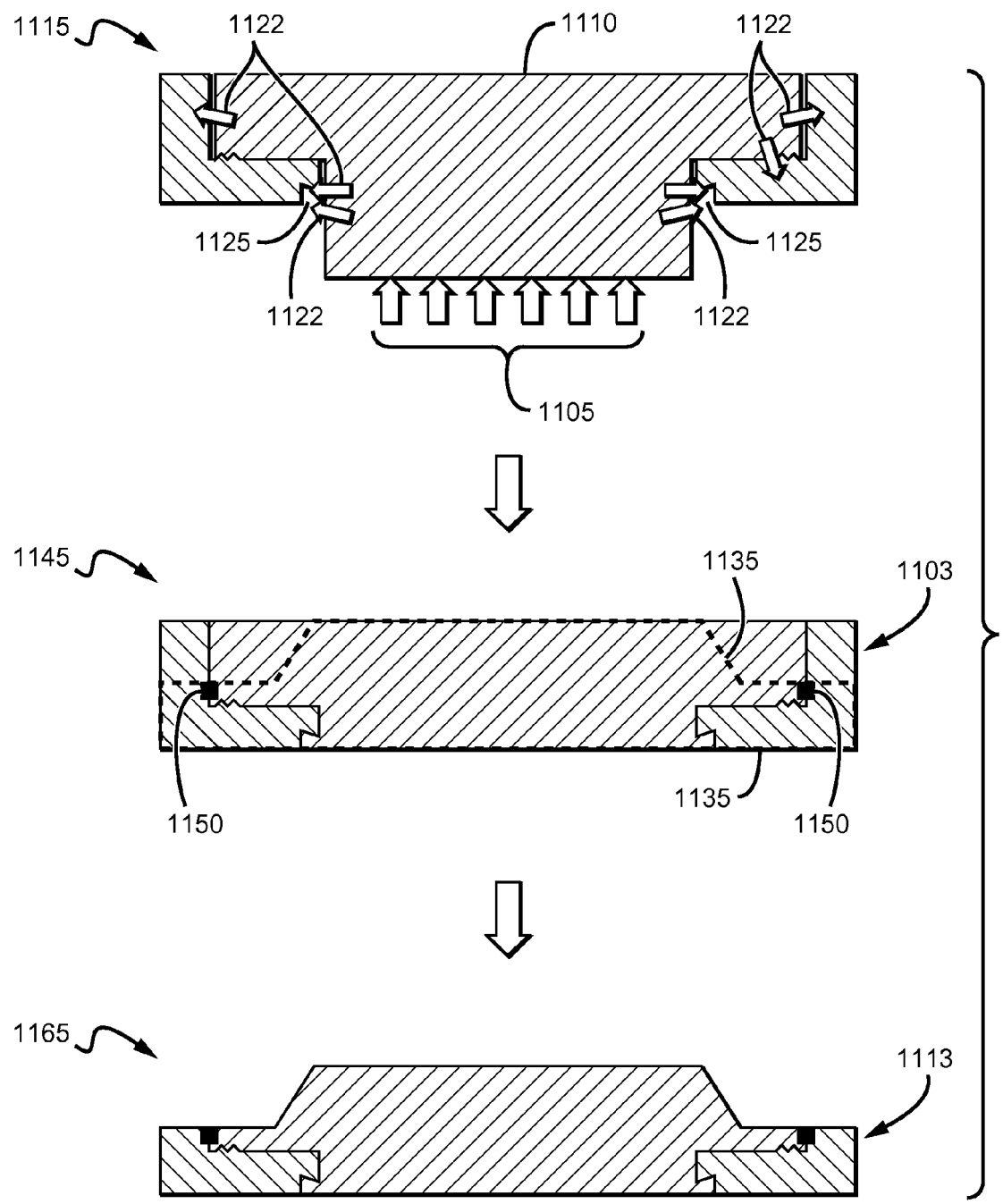
FIG. 11 illustrates how a target is usually machined, and if necessary, welded after the pressing step.

FIG. 11 illustrates how a target is usually machined, and if necessary, welded after the pressing step. It is also possible to make special die system to limit the amount of material to be machined away. In the first step 1115, the rivet is forged. Pressure 1105 is applied to the bottom side of the target surface material 1110, which may be a lower strength material, such as an ECAE material, and causes material to flow 1122 and fill up the recess space 1125. In the second step 1145, the target assembly 1103 is machined along the dotted or broken lines 1135 and welded at the welding points 1150. In the third step 1165, the final sputtering target 1113 is cleaned.

Figure 12:
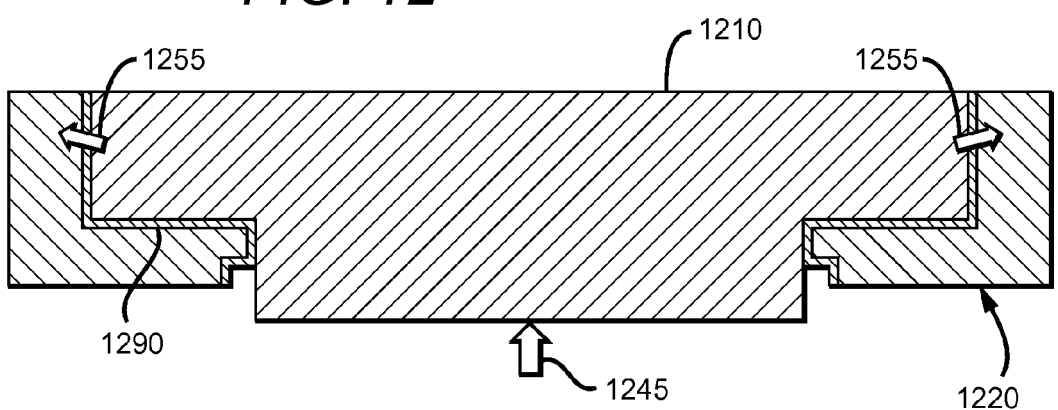
FIG. 12 shows one contemplated embodiment where at least one additional material 1290 is placed in or on the interface between the target surface material 1210 and the core backing component 1220 to improve the thermal and electrical contact.

FIG. 12 shows one contemplated embodiment where at least one additional material 1290, such as filler material or brazing material, is placed in or on the interface between the target surface material 1210 and the core backing component 1220 to improve the thermal and electrical contact. When pressure 1245 is applied to the target surface material 1210, material flows 1255 in the direction of the core backing component 1220. The material may comprise any suitable material that can withstand the temperatures of the forge reinforcement step, such as a conductive solder or polymer, thermal interface paste, a thermally or electrically conductive material. Some suitable materials are those manufactured by Honeywell International Inc., including those found in U.S. Pat. Nos. 6,451,422, 6,673,434, 6,797,382, 6,908,669, 7,244,491 and U.S. patent application Ser. Nos. 09/851,103, 10/775,989, 10/465,968, 10/511,454, 10/545,597, 10/519,337, 10/551,305, 11/641,367, 11/334,637, 11/702,351, 11/809,131, 60/844,445, and their PCT and foreign counterparts. The at least one additional material 1290 is pressed during the forge reinforcement step 1260. Alternatively, the surface of the target material and core backing plate material can be specially machined, cleaned and surface treated to deposit at least one additional material, which creates a better bond at the interface during the forge reinforcement step. Surface treatment includes any coating method such as plating, vapor deposition, spraying, mechanical alloying, shot peening and combination thereof.

Sputtering targets contemplated herein may generally comprise any material that can be a) reliably formed into a sputtering target; b) sputtered from the target when bombarded by an energy source; and c) suitable for forming a final or precursor layer on a wafer or surface. Materials that are contemplated to make suitable sputtering targets are metals, metal alloys, conductive polymers, conductive composite materials, dielectric materials, hardmask materials and any other suitable sputtering material. In some embodiments, the target surface component and the core backing component comprise the same material as the target material. In yet other embodiments, the target surface component and the core backing component are coupled such that they form a monolithic sputtering target and/or sputtering target assembly.

As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include titanium, silicon, cobalt, copper, nickel, iron, zinc, vanadium, zirconium, aluminum and aluminum-based materials, tantalum, niobium, tin, chromium, platinum, palladium, gold, silver, tungsten, molybdenum, cerium, promethium, ruthenium or a combination thereof. More preferred metals include copper, aluminum, tungsten, titanium, cobalt, tantalum, magnesium, lithium, silicon, manganese, iron or a combination thereof. Most preferred metals include copper, aluminum and aluminum-based materials, tungsten, titanium, zirconium, cobalt, tantalum, niobium, ruthenium or a combination thereof.

Examples of contemplated and preferred materials, include aluminum and copper for superfine grained aluminum and copper sputtering targets; aluminum, copper, cobalt, tantalum, zirconium, and titanium for use in 200 mm and 300 mm sputtering targets, along with other mm-sized targets; and aluminum for use in aluminum sputtering targets that deposit a thin, high conformal "seed" layer or "blanket" layer of aluminum surface layers. It should be understood that the phrase "and combinations thereof" is herein used to mean that there may be metal impurities in some of the sputtering targets, such as a copper sputtering target with chromium and aluminum impurities, or there may be an intentional combination of metals and other materials that make up the sputtering target, such as those targets comprising alloys, borides, carbides, fluorides, nitrides, silicides, oxides and others.

The term "metal" also includes alloys, metal/metal composites, metal ceramic composites, metal polymer composites, as well as other metal composites. Alloys contemplated herein comprise gold, antimony, arsenic, boron, copper, germanium, nickel, indium, palladium, phosphorus, silicon, cobalt, vanadium, iron, hafnium, titanium, iridium, zirconium, tungsten, silver, platinum, ruthenium, tantalum, tin, zinc, rhenium, and/or rhodium. Specific alloys include gold antimony, gold arsenic, gold boron, gold copper, gold germanium, gold nickel, gold nickel indium, gold palladium, gold phosphorus, gold silicon, gold silver platinum, gold tantalum, gold tin, gold zinc, palladium lithium, palladium manganese, palladium nickel, platinum palladium, palladium rhenium, platinum rhodium, silver arsenic, silver copper, silver gallium, silver gold, silver palladium, silver titanium, titanium zirconium, aluminum copper, aluminum silicon, aluminum silicon copper, aluminum titanium, chromium copper, chromium manganese palladium, chromium manganese platinum, chromium molybdenum, chromium ruthenium, cobalt platinum, cobalt zirconium niobium, cobalt zirconium rhodium, cobalt zirconium tantalum, copper nickel, iron aluminum, iron rhodium, iron tantalum, chromium silicon oxide, chromium vanadium, cobalt chromium, cobalt chromium nickel, cobalt chromium platinum, cobalt chromium tantalum, cobalt chromium tantalum platinum, cobalt iron, cobalt iron boron, cobalt iron chromium, cobalt iron zirconium, cobalt nickel, cobalt nickel chromium, cobalt nickel iron, cobalt nickel hafnium, cobalt niobium hafnium, cobalt niobium iron, cobalt niobium titanium, iron tantalum chromium, manganese iridium, manganese palladium platinum, manganese platinum, manganese rhodium, manganese ruthenium, nickel chromium, nickel chromium silicon, nickel cobalt iron, nickel iron, nickel iron chromium, nickel iron rhodium, nickel iron zirconium, nickel manganese, nickel vanadium, tungsten titanium, tantalum ruthenium, copper manganese, germanium antimony telluride, copper gallium, indium selenide, copper indium selenide and copper indium gallium selenide, chalcogenides and/or combinations thereof.

As far as other materials that are contemplated herein for sputtering targets, the following combinations are considered examples of contemplated sputtering targets (although the list is not exhaustive): chromium boride, lanthanum boride, molybdenum boride, niobium boride, tantalum boride, titanium boride, tungsten boride, vanadium boride, zirconium boride, boron carbide, chromium carbide, molybdenum carbide, niobium carbide, silicon carbide, tantalum carbide, titanium carbide, tungsten carbide, vanadium carbide, zirconium carbide, aluminum fluoride, barium fluoride, calcium fluoride, cerium fluoride, cryolite, lithium fluoride, magnesium fluoride, potassium fluoride, rare earth fluorides, sodium fluoride, aluminum nitride, boron nitride, niobium nitride, silicon nitride, tantalum nitride, titanium nitride, vanadium nitride, zirconium nitride, chromium silicide, molybdenum silicide, niobium silicide, tantalum silicide, titanium silicide, tungsten silicide, vanadium silicide, zirconium silicide, aluminum oxide, antimony oxide, barium oxide, barium titanate, bismuth oxide, bismuth titanate, barium strontium titanate, chromium oxide, copper oxide, hafnium oxide, magnesium oxide, molybdenum oxide, niobium pentoxide, rare earth oxides, silicon dioxide, silicon monoxide, strontium oxide, strontium titanate, tantalum pentoxide, tin oxide, indium oxide, indium tin oxide, lanthanum aluminate, lanthanum oxide, lead titanate, lead zirconate, lead zirconate-titanate, titanium aluminide, lithium niobate, titanium oxide, tungsten oxide, yttrium oxide, zinc oxide, zirconium oxide, bismuth telluride, cadmium selenide, cadmium telluride, lead selenide, lead sulfide, lead telluride, molybdenum selenide, molybdenum sulfide, zinc selenide, zinc sulfide, zinc telluride and/or combinations thereof. In some embodiments, contemplated materials include those materials disclosed in U.S. Pat. No. 6,331,233, which is commonly-owned by Honeywell International Inc., and which is incorporated herein in its entirety by reference.

Contemplated core backing component materials and/or the target surface component constituents or materials may be provided by any suitable method, including a) buying the core material and/or the surface material constituents from a supplier; b) preparing or producing the core material and/or the surface material constituents in house using chemicals provided by another source and/or c) preparing or producing the core material and/or the surface material constituents in house using chemicals also produced or provided in house or at the location.

The core material and/or the surface material constituents may be combined by any suitable method known in the art or conventionally used, including melting the constituents and blending the molten constituents, processing the material constituents into shavings or pellets and combining the constituents by a mixing and pressure treating process, and the like.

In some embodiments, namely the monolithic or unibody target configurations the surface target component and the core backing component may comprise the same target material. However, there are contemplated monolithic or unibody target configurations and designs where there is a material gradient throughout the sputtering target and/or sputtering target assembly. A "material gradient", as used herein, means that the sputtering target or sputtering target assembly comprises at least two of the materials contemplated herein, wherein the materials are located in the sputtering target in a gradient pattern. For example, a sputtering target or target assembly may comprise copper and titanium. The surface target material of this same target may comprise 90% copper and 10% titanium. If one viewed a cross-section of the target assembly or sputtering target, the amount or percentage of copper would decrease approaching the core backing component and the titanium percentage would increase approaching the core backing component. It is contemplated that the titanium percentage may decrease approaching the core backing material and the copper percentage may increase approaching the core backing component resulting in a 100% copper core backing component. A material gradient may be advantageous in order to detect wear of the target or to prepare subsequent layers that contain more or less of a certain component. It is also contemplated that a material gradient may comprise three or more constituents, depending on the needs of the layer, the component, the device and/or the vendor.

Another sputtering target and/or sputtering target assembly is described herein that comprises: a) a target surface component comprising a target material; b) a annular core backing component having a coupling surface, a back surface and at least one opening or open area, wherein the coupling surface is coupled to at least part of the target surface component; and wherein at least part of the target surface component fits into the at least one opening or open area of the core backing component and wherein, the core backing component or a combination thereof have at least one surface area feature coupled to or located in the back surface of the core backing component, the target surface component or a combination thereof, wherein the surface area feature increases the cooling effectiveness of the target surface component and wherein the surface area feature comprises a subtractive feature, an additive feature or a combination thereof. The surface area feature comprises either: a) a convex feature, a concave feature or a combination thereof; or b) an additive feature, a subtractive feature or a combination thereof.

In some embodiments, the at least one surface area feature is incorporated or added/subtracted to/from the core backing component and/or the target surface component. The at least one surface area feature, which is designed in some embodiments to increase the cooling efficiency of the annular core backing component, the target surface component or a combination thereof, is different from a conventional surface area feature on a conventional sputtering target. As used herein, the phrase "conventional surface area feature" means those surface area features that are not intentionally modified in order to increase the cooling efficiency of the feature. The at least one surface area feature contemplated herein comprise altered microstructures, microgrooves, slits or cracks, erosion profile modifications and combinations thereof. It should be understood that all of these modified surface area features are intended to increase the cooling efficiency at the back of the sputtering target.

One contemplated surface area feature is an altered microstructure, which can be produced a number of ways, including alloying the back surface of the core backing component, introducing deformation or materials to the surface, or a combination thereof. In other contemplated embodiments, the microstructure of the back surface can be altered a) by coating—in full or in part—the back surface by utilizing a suitable coating process, such as electroplating or vapor deposition, which may be followed by an annealing process that allows the coating to diffuse into the core backing component of the target; b) by ion-implantation (another alloying process); c) shot peening or any other suitable deformation process; d) mechanical alloying methods where small particles of alloying elements hit the back surface at a high speed; or e) a combination thereof.

Another contemplated surface area feature is obtained by introducing microgrooves, slits and cracks into the back surface of the core backing component, which changes the geometry of the target in order to increase the cooling efficiency of the back surface, target surface or combination thereof. With respect to whether its advantageous to introduce either random, patterned or a combination thereof of microgrooves, slits and cracks in to the core backing material, this decision usually depends on the specifics of the magnetrons and on the desired effects of the fluid flow behind the core backing component. One of ordinary skill in the art of sputtering target assemblies should understand this concept after reviewing this disclosure and understand how to modify the surface area feature based on the specifics of the magnetrons and on the desired effects of the fluid flow behind the core backing component. One method of modifying the surface area feature of the core backing component in this fashion is shown in PCT Application Serial No.: PCT/US02/06146 or Publication No.: WO 03/000950 entitled "Morphologically Tailored Omni-Focal Target", which was filed on Feb. 20, 2002, is commonly-owned, and which is incorporated herein in its entirety by reference.

As used herein, the phrases "convex feature", "concave feature" or "a combination thereof" means that, in relation to each feature, that the feature is formed as part of the core backing component, target surface component or combination thereof when each of those components are formed. An example of these embodiments is where the target surface component is formed using a mold and the convex features, the concave features and/or the combination thereof of the features are part of the back surface mold design. As used herein, the phrases "additive feature", "subtractive feature" or "a combination thereof" mean that, in relation to each feature, that the feature is formed after the individual component is formed. An example of these embodiments is where the core backing component is formed by any suitable method or apparatus and then the features are formed in or on the back surface or the coupling surface of the core backing component by a drill, a solder process or some other process or apparatus that can be used to either add (thus forming an additive feature) or subtract material (thus forming a subtractive feature) from the core backing component in a way so as to form the features.

As used herein, the phrases "additive feature", "subtractive feature", "convex feature" and "concave feature" are used to describe channels, grooves, bumps and/or indentations can be produced in or on the core backing component of the sputtering target. The channels, grooves, bumps, dimples, indentations or a combination thereof serve several beneficial needs, as described earlier, while at the same time increasing the surface area of the back of the target. As mentioned, by placing the channels, grooves, bumps, dimples, indentations or a combination thereof along the entire back surface of or the center of the target surface component, the cooling efficiency of the method of cooling and cooling fluid is increased over conventional side cooling. The channels, grooves, bumps, dimples, indentations or a combination thereof may also be placed in or on the coupling surface of the core backing component.

The channels, grooves, bumps, dimples, indentations or a combination thereof can be arranged or formed in or on the core backing component, target surface component or a combination thereof in any suitable shape, including concentric circles or grooves, a spiral configuration, a "side" facing chevron or a "center" pointing chevron. In other embodiments, bumps or other configurations formed from core backing component material or another comparable material can be "built up" on the back surface or coupling surface of the core backing component, the target surface component or a combination thereof in order to effectively increase the surface area of the component and/or sputtering target assembly. It is further contemplated that the material used to build up a pattern or formation on the back of the component can not only increase the surface area of the backing plate, but may also work in conjunction with the cooling device/method to further enhance the cooling effect on the target and/or reduce unwanted deflection of atoms and/or molecules from the target surface component of the sputtering target assembly.

The channels, grooves, bumps, dimples, indentations or a combination thereof can be formed on the components by using any suitable method or device, including machining, LASERs and the like, as previously described, resulting in at least one additive feature, at least one subtractive feature or a combination thereof. The target components may also be molded originally to include the channels, grooves, bumps, dimples, indentations or a combination thereof resulting in at least one convex feature, at least one concave feature or a combination thereof, depending on the machinery of the vendor and the needs of the customer using the target.

In some embodiments, the cooling efficiency of the core backing component comprising at least one opening or open area, target surface component or combination thereof is increased as compared with the cooling efficiency of a conventional core backing component. In other embodiments, the cooling efficiency of the core backing component comprising at least one opening or open area, target surface component or combination thereof is increased by at least 10% as compared with the cooling efficiency of a conventional core backing component. In yet other embodiments, the cooling efficiency of the core backing component comprising at least one opening or open area, target surface component or combination thereof is increased by at least 50% as compared with the cooling efficiency of a conventional core backing component.

Figure 13:
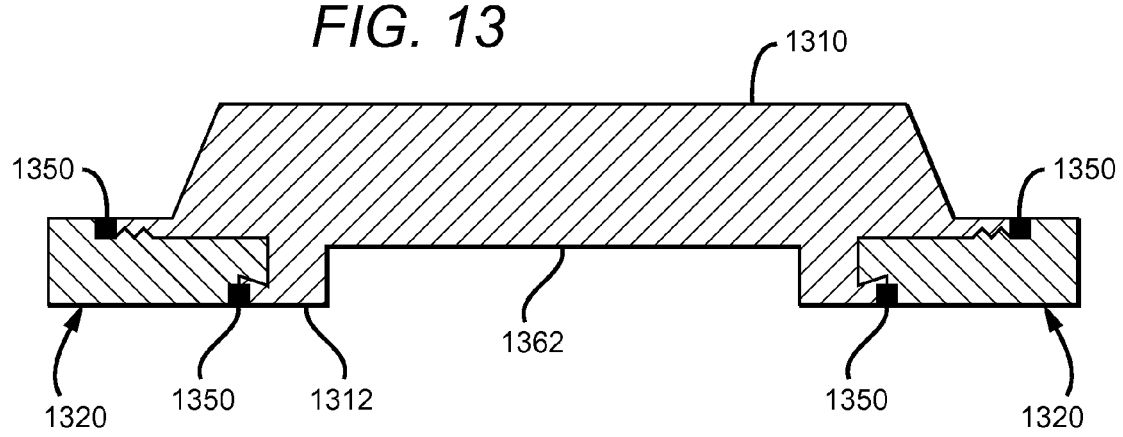
FIG. 13 shows a contemplated target assembly.

In some embodiments, it is possible to improve the cooling efficiency in at least one (or several) open areas where the target fits into the core backing component. Cooling can be improved by using a backing plate with high thermal conductivity, increasing cooling surface area, controlling the flow pattern of coolant, improving coolant circulation with the rotating magnets, and lastly by reducing the thickness of the target material. Among these factors, the thickness is the most sensitive factor that controls the cooling. In the past, various attempts have been made to improve the cooling efficiency via various design modification, but the most important—the thickness factor—has not been considered for heat reduction. In FIG. 13, which comprises an ECAE target material, for example, a recessed pocket 1362 is machined within the central area of the backside surface 1312 of the target surface material 1310 which reduces the thickness between the sputtered surface and the opposite surface in contact with coolant. This modification reduces the temperature gradient through the target material and effectively lowers target temperature. Weld points 1350 are shown that help to couple the target surface material 1310 with the core backing component 1320.

Figure 14A:
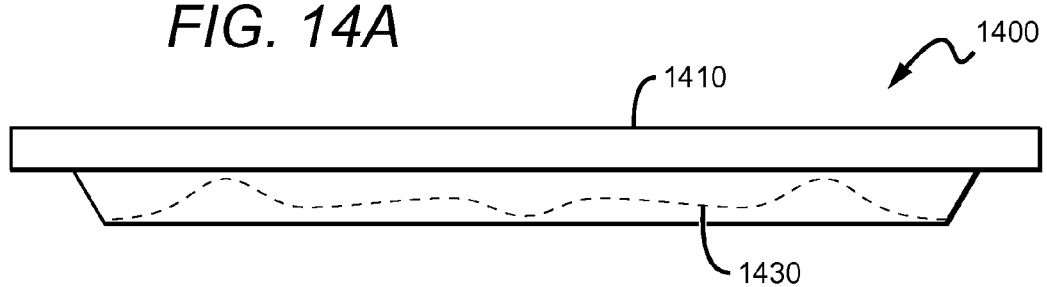
FIG. 14A shows a conventional target having an erosion profile.
Figure 14B:
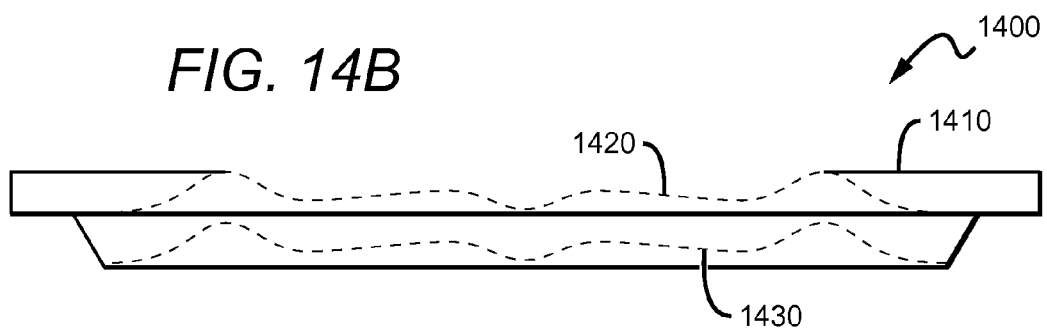
FIG. 14B shows a conventional target showing erosion and having an erosion profile.

Yet another contemplated surface area feature is to tailor the surface area feature such that it mirrors the erosion profile of the target surface—what is called erosion profile modification, which is shown in FIGS. 14A and 14B. A conventional target 1400 is shown in FIG. 14A having a surface 1410. In FIG. 14B, this surface 1410 is now exhibiting erosion 1420 that mirrors the erosion profile 1430 shown in FIGS. 14A and 14B. A similar erosion profile is also shown in FIG. 1C, where openings in the core backing component are tailored to match the erosion profile. As background for this particular modification, in DC magnetron sputtering, a high flux of Ar+ ions is bombarding the target at high power, often exceeding a few to several tens of kilo-watts. Such a high power can melt the target without proper cooling, or degrade the mechanical stability if cooling is insufficient. Four main factors control the cooling, namely thermal conductivity, cooling water flow rate, cooling surface area, and the thickness of a target.

Any of the above modification techniques and approaches for modifying the surface area feature of a sputtering target can be utilized alone or in combination with one another depending on the needs of the operator. What is exceptional about the subject matter described herein is that all of these approaches can be utilized on conventional sputtering targets, without altering the profile of sputtering surface. Many of these embodiments are also disclosed in U.S. Ser. No. 11/656, 705, which was filed on Jan. 22, 2007, is commonly-owned by Honeywell International Inc. and is incorporated herein in its entirety by reference.

For electronic and semiconductor applications and components, such as components and materials that comprise a layer of conductive material, the cooling device utilized for a sputtering target or other similar type of component that is used to lay down or apply the conductive layer of material is placed adjacent to the components of the sputtering target and/or sputtering target assembly. In some contemplated embodiments, as mentioned earlier, target components have channels, grooves, bumps, dimples, indentations or a combination thereof formed in or on the coupling side or back side of the component and the cooling device or method not only contacts the core backing component, but also contacts the channels, grooves, bumps, dimples, indentations or a combination thereof. If both the cooling enhancement method and/or device is being used in conjunction with the sensing/sensor device/method there will be channels located between the target and the backing plate for the sensing/sensor device and there will be channels, grooves, bumps, dimples, indentations or a combination thereof formed in the backing plate that will increase the effective surface area of the backing plate of the target when in contact with a cooling fluid or cooling method. It should be appreciated, however, that the cooling enhancement method and/or device could be used alone without the sensing/sensor device and/or method.

As mentioned above, in some embodiments, it would also be beneficial to include a sensing system that would a) comprise a simple device/apparatus and/or mechanical setup and a simple method for determining wear, wear-out and/or deterioration of a surface or material; b) would notify the operator when maintenance is necessary, as opposed to investigating the quality of the material on a specific maintenance schedule; and c) would reduce and/or eliminate material waste by reducing and/or eliminating premature replacement or repair of the material. Devices and methods of this type are described in PCT Application Serial No.: PCT/US03/28832, which was filed on Sep. 12, 2003 and claims priority to U.S. Provisional Application Ser. No. 60/410,540, which was filed on Sep. 12, 2002, both of which are commonly-owned and incorporated herein in their entirety.

In some embodiments, the incorporation of the channels, grooves, bumps, dimples, indentations or a combination thereof will not only improve the cooling of the sputtering target and/or sputtering target assembly, but will also improve the cooling fluid flow along the core backing component. This improvement in cooling fluid flow can easily be attributed to and explained by conventional fluid mechanics principles.

The cooling fluid used in the cooling enhancement device and/or method may comprise any fluid that can be held at a particular temperature for the purpose of cooling a surface or can effect the cooling of a surface on contact. As used herein, the term "fluid" may comprise either a liquid or a gas. As used herein, any references to the term "gas" means that environment that contains pure gases, including nitrogen, helium, or argon, carbon dioxide, or mixed gases, including air. For the purposes of the present subject matter, any gas that is suitable to use in an electronic or semiconductor application is contemplated herein.

Contemplated sputtering targets described herein can be incorporated into any process or production design that produces, builds or otherwise modifies electronic, semiconductor and communication components. Electronic, semiconductor and communication components are generally thought to comprise any layered component that can be utilized in an electronic-based, semiconductor-based or communication-based product. Components described herein comprise semiconductor chips, circuit boards, chip packaging, separator sheets, dielectric components of circuit boards, printed-wiring boards, touch pads, displays, wave guides, fiber optic and photon-transport and acoustic-wave-transport components, any materials made using or incorporating a dual damascene process, and other components of circuit boards, such as capacitors, inductors, and resistors.

Thin layers or films produced by the sputtering of atoms or molecules from targets discussed herein can be formed on any number or consistency of layers, including other metal layers, substrate layers, dielectric layers, hardmask or etchstop layers, photolithographic layers, anti-reflective layers, etc. In some preferred embodiments, the dielectric layer may comprise dielectric materials contemplated, produced or disclosed by Honeywell International, Inc. including, but not limited to: a) FLARE (polyarylene ether), such as those compounds disclosed in issued patents U.S. Pat. Nos. 5,959,157, 5,986,045, 6,124,421, 6,156,812, 6,172,128, 6,171,687, 6,214,746, and pending applications Ser. Nos. 09/197,478, 09/538,276, 09/544,504, 09/741,634, 09/651,396, 09/545, 058, 09/587,851, 09/618,945, 09/619,237, 09/792,606, b) adamantane-based materials, such as those shown in pending application Ser. No. 09/545,058; Serial PCT/US01/22204 filed Oct. 17, 2001; PCT/US01/50182 filed Dec. 31, 2001; 60/345,374 filed Dec. 31, 2001; 60/347,195 filed Jan. 8, 2002; and 60/350,187filed Jan. 15, 2002; c) commonly assigned U.S. Pat. Nos. 5,115,082; 5,986,045; and 6,143,855; and commonly assigned International Patent Publications WO 01/29052published Apr. 26, 2001; and WO 01/29141 published Apr. 26, 2001; and (d) nanoporous silica materials and silica-based compounds, such as those compounds disclosed in issued patents U.S. Pat. Nos. 6,022,812, 6,037,275, 6,042, 994, 6,048,804, 6,090,448, 6,126,733, 6,140,254, 6,204,202, 6,208,014, and pending applications Ser. Nos. 09/046,474, 09/046,473, 09/111,084, 09/360,131, 09/378,705, 09/234, 609, 09/379,866, 09/141,287, 09/379,484, 09/392,413, 09/549,659, 09/488,075, 09/566,287, and 09/214,219 all of which are incorporated by reference herein in their entirety and (e) Honeywell HOSP® organosiloxane.

The wafer or substrate may comprise any desirable substantially solid material. Particularly desirable substrates would comprise glass, ceramic, plastic, metal or coated metal, or composite material. In preferred embodiments, the substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and its oxides), a polymer-based packaging or board interface such as found in a polyimide-based flex package, lead or other metal alloy solder ball surface, glass and polymers such as polyimides. In more preferred embodiments, the substrate comprises a material common in the packaging and circuit board industries such as silicon, copper, glass, or a polymer.

Substrate layers contemplated herein may also comprise at least two layers of materials. One layer of material comprising the substrate layer may include the substrate materials previously described. Other layers of material comprising the substrate layer may include layers of polymers, monomers, organic compounds, inorganic compounds, organometallic compounds, continuous layers and nanoporous layers.

The substrate layer may also comprise a plurality of voids if it is desirable for the material to be nanoporous instead of continuous. Voids are typically spherical, but may alternatively or additionally have any suitable shape, including tubular, lamellar, discoidal, or other shapes. It is also contemplated that voids may have any appropriate diameter. It is further contemplated that at least some of the voids may connect with adjacent voids to create a structure with a significant amount of connected or "open" porosity. The voids preferably have a mean diameter of less than 1 micrometer, and more preferably have a mean diameter of less than 100 nanometers, and still more preferably have a mean diameter of less than 10 nanometers. It is further contemplated that the voids may be uniformly or randomly dispersed within the substrate layer. In a preferred embodiment, the voids are uniformly dispersed within the substrate layer.

Several advantages are realized with contemplated embodiments disclosed herein over conventional target designs having diffusion bonded, soldered or mono target/backing plate designs. The advantages over standard soldered or diffusion bonded targets include: a) low temperature method that does not increase the target grain size or microstructure size, b) strong coupling between target and core backing material with little to no risk of decoupling (such as seen during debonding), especially for the mechanical attachment, c) longer target life, because there is no joining interface below the erosion profile, and therefore the erosion profile can be deeper, d) better cooling because there is direct contact of target with cooling fluid, no or less interface between sputtered target volume and cooling fluid and backing plate and target thickness can be locally reduced, and e) reduced target warping, because there is more room for the target to expand laterally by virtue of the gap at the interface between the target and the backing plate. Several advantages over monolithic designs are also seen, including: a) a stronger design, especially at the flange area, because of stronger backing plate material, and b) less warpage expected because of 1) a stronger flange and 2) a gap at the interface between the target and backing plate, which allows the target to expand more laterally and less vertically.

EXAMPLES

Example 1

Figure 15:
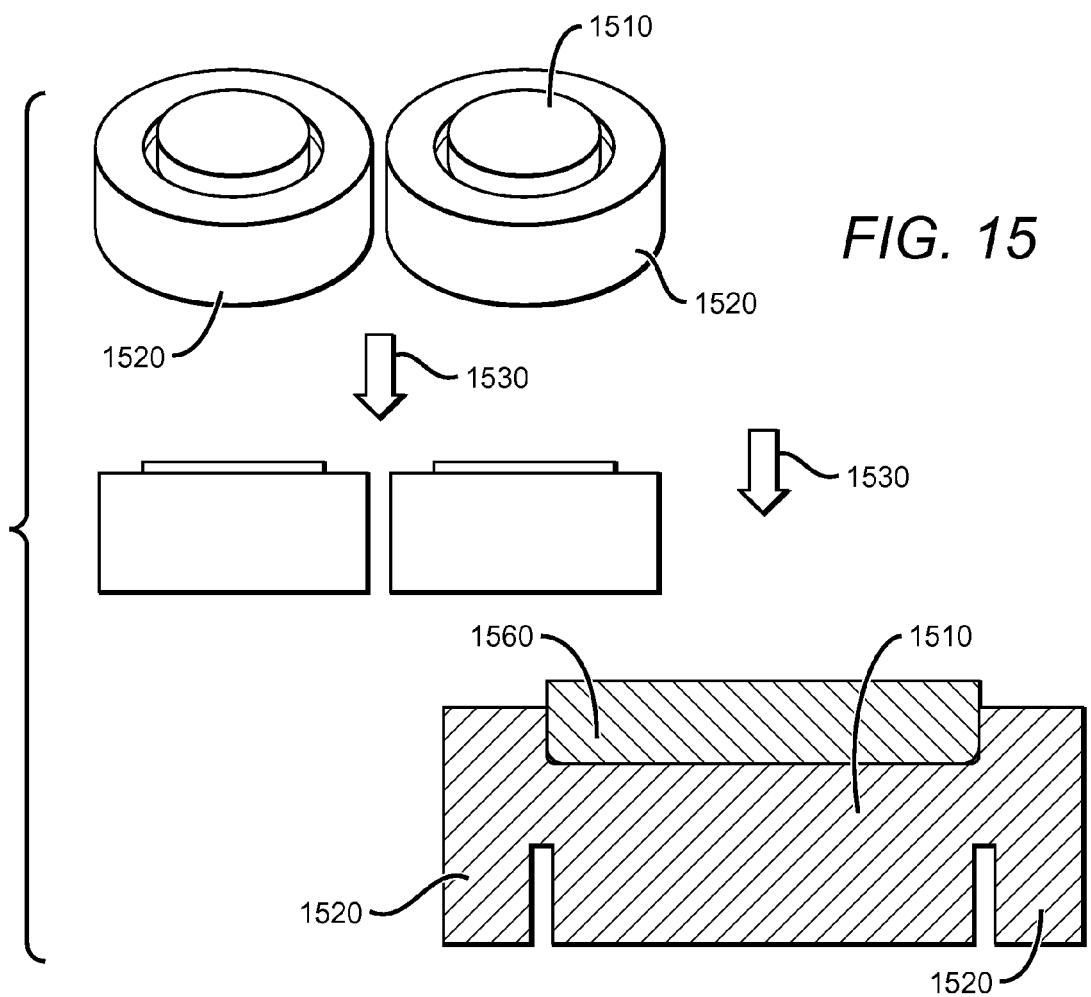
FIG. 15 shows a contemplated target assembly.

Forge reinforce a submicron ECAE Al0.5Cu target material 1510 at room temperature to an annular Al 2024 T851 backing plate 1520, as shown in FIG. 15. The forge reinforcement is conducted by applying pressure through cold forging 1530. The initial and final height of the central target material is 1.25 inch and 1.05 inch respectively. The submicron Al0.5Cu structure is stable after forging as observed by optical microscopy. Grain size is around 0.5 microns. The forged rivet 1560 is shown in the cross-section.

Example 2

Figure 16:
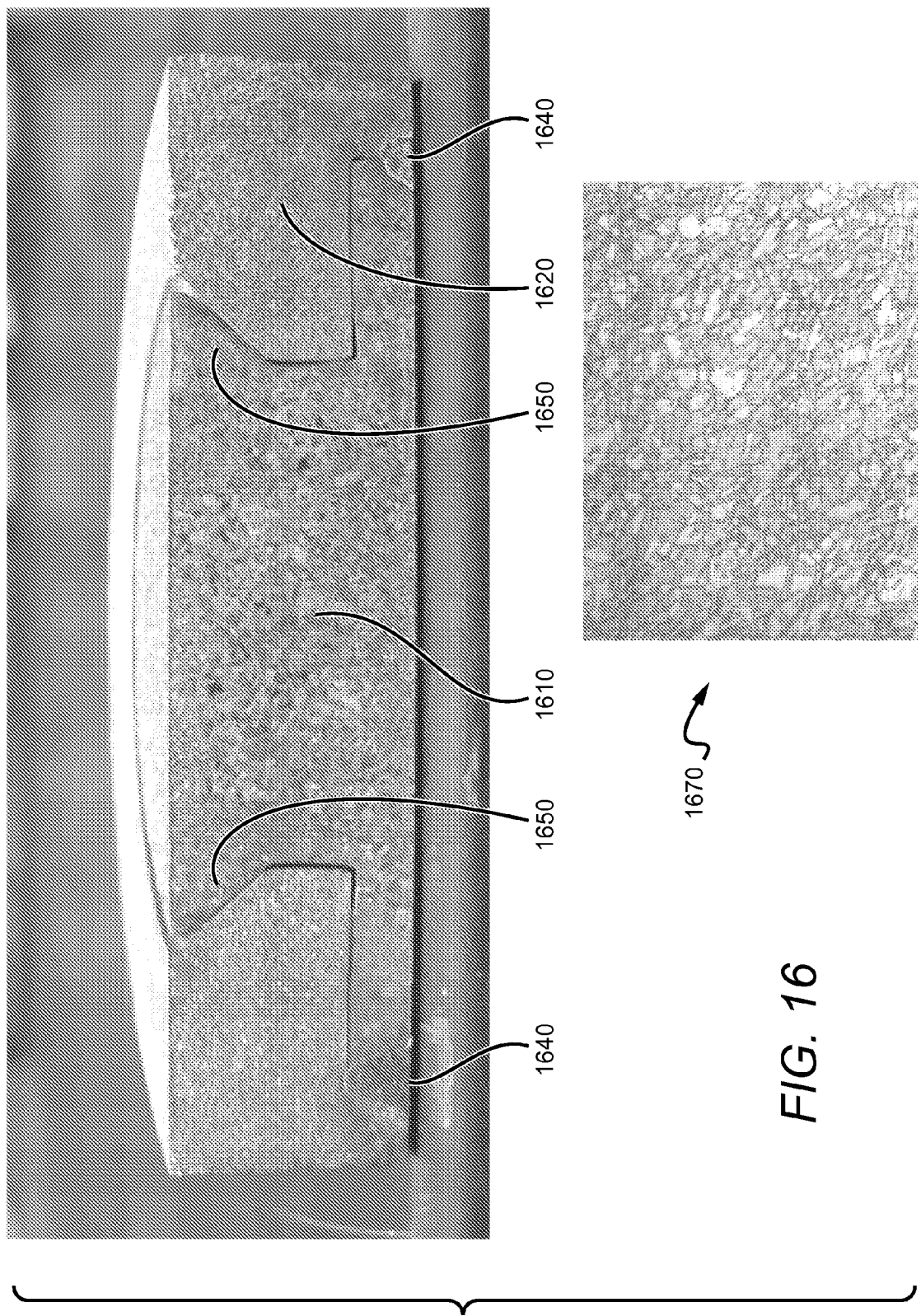
FIG. 16 shows a picture of a target assembly after a forge reinforcement step.

Forge reinforce at room temperature or at 150 C of ECAE Cu target material 1610 with an ultrafine grain size of 5-15 microns to an annular CuCr backing plate 1620. Four samples were generated with two types of rivet designs 1650. The initial and final height of the central target material before and after forging is 1.0 inch and 0.6 inch respectively. FIG. 16 shows a picture of such an assembly after the forge reinforcement step. Two samples were e-beam welded 1640 after the forge reinforcement step. The grain size of 5-15 microns structure is preserved after the forging step except in the area where the material has to flow (key area)—shown in breakout 1670. In those small regions, the structure is deformed but since those areas are opposite to the surface to be sputtered, it does not affect sputtering performance.

Example 3

Forge reinforce at room temperature of two ECAE Cu targets material with an ultrafine grain size of 5-15 microns to an annular Al2024 T851 backing plate. The final target height after the forge reinforcement step is 0.6 inch and 1.0 inch. Various target diameters of 1.5 inch, 4 inch, 13.8 inch and 18.35 inch were used. In one sample, an upper ring is used to press the edges of the Cu target in order to form the rivet-like feature and provide a near net shape design according to methods described in FIGS. 10A and 10B. For the other sample, the surface of the Cu Target to be pressed was machined prior to the forge reinforcement step, and the edge part was pressed to form the rivet-like feature according to FIG. 10A. In all cases, the forging step was conducted at room temperature and resulted in no alteration of the initial target grain size of 5-15 microns.

Example 4

Figure 17:
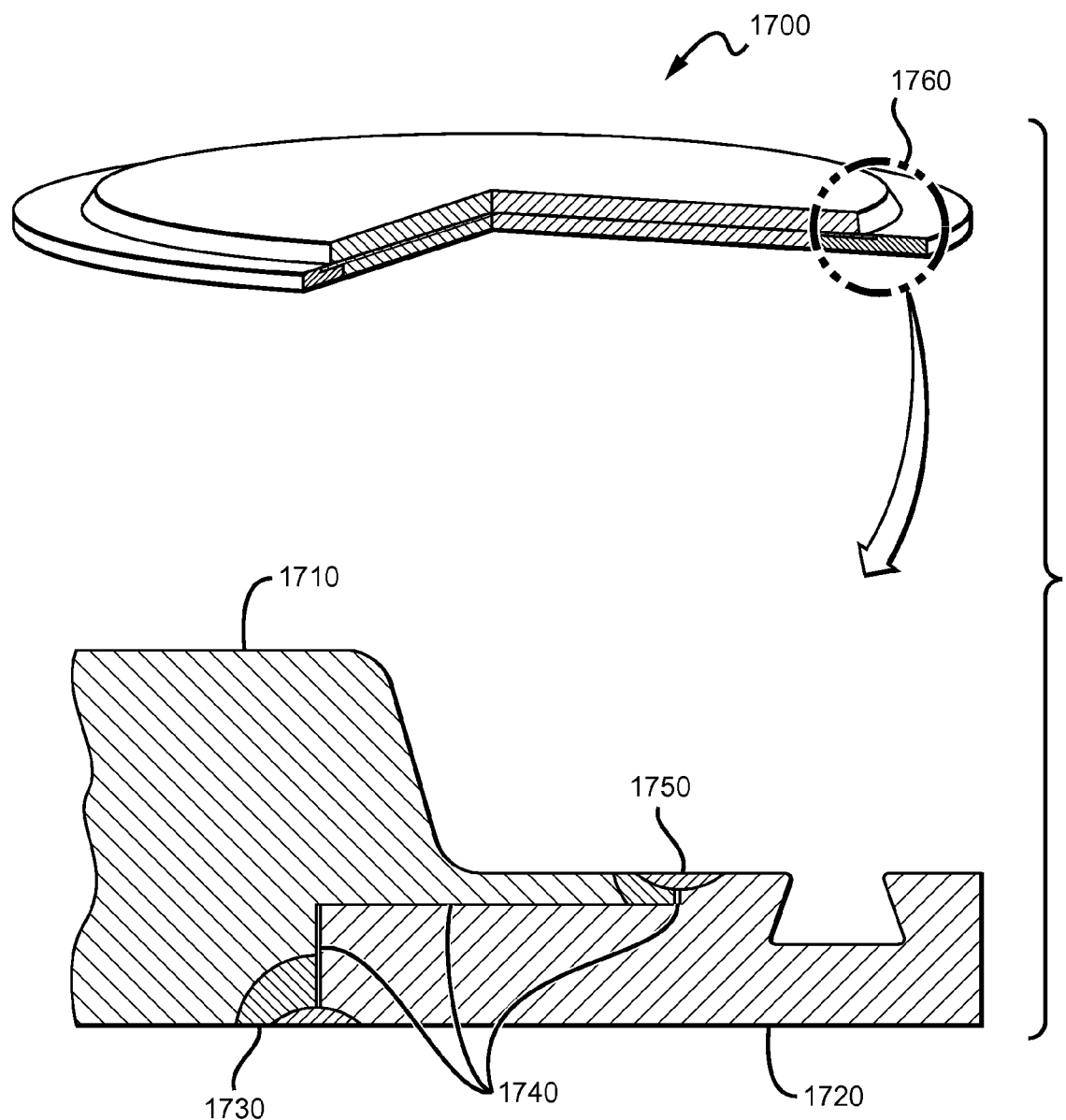
FIG. 17 shows a model study of a contemplated target assembly.

Finite Element modeling was used to assess the thermomechanical behavior of various target designs with annular backing plates. For example, an Al0.5Cu ECAE target bonded to an annular high strength Al alloy backing plate was modeled. The overall configuration was that of 300 mm Al ALPS target. The pads were joined by welds, and the welds were modeled as consisting of a lenticular shaped 'weld' with a yield strength of 40 MPa and semi-circular heat affected zone in which the yield strength of the ECAE material was reduced to that of high purity Al0.5Cu with grain size larger than 50 micron (from 190 MPa down to 25 MPa). With the exception of the lenticular shaped weld, the interface between the backing plate and target material was modeled as a thermal break (gap) between the materials, as shown in FIG. 17. In FIG. 17, a breakout portion 1760 of the target assembly 1700 is shown. The heat affected zone 1730, gaps 1740 and weld points 1750 are shown on at the interface points between the target surface material 1710 and the core backing component 1720.

One purpose of the models was to study the effect the location of the interface has on target temperatures. We compared the maximum target temperatures under normal operating conditions to the maximum temperature in a monolithic design. We found that the maximum temperatures started rising quickly once the ID became less than 13" and at 12" was about 50° C. higher than the base case. Similarly, a 300 mm Cu SIP Encore target requires the ID of the backing plate to be greater than 14" to prevent temperatures to rise by more than 50° C. in comparison to a monolithic design under normal operating conditions. These results have to be looked at as worst case scenarios because the interface was modeled as a thermal break. In the real world, the target and backing plate will be in thermal contact at, at least, a few areas along the interface and the target temperatures will be lower. A thermal filler material could also be used to ensure thermal contact along the entire interface.

The target heats up during deposition of a thin film and cools down during the time the wafer is exchanged. Thus, another purpose of the model was to study on how thermal cycling will affect the welds. We found that strain accumulated in the welds and that the amount of strain was sensitive to the size of the gap between the materials. To reduce variability and increase reliability of the weld we found it advantageous to modify the shape of the interface in front of the welds such that the forces due to thermal expansion are carried by direct interaction of the backing plate and target material and thus reduce the amount of strain in the weld. In one embodiment, the strain in the welds was reduced from 8 to 6% by the introduction of these weld reinforcements.

Thus, specific embodiments and applications of target designs and related methods for increased resistivity and/or resistance, reduced Eddy currents and enhanced cooling have been disclosed. It should be apparent, however, to those skilled in the art that many more modifications besides those already described are possible without departing from the inventive concepts herein. The inventive subject matter, therefore, including the claims is not to be restricted except in the spirit of the specification disclosed herein. Moreover, in interpreting the specification and claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claim:

1. A sputtering target, comprising:
a front target surface;
a back target surface opposite the front target surface;
a target surface component comprising a target material; and
a core backing component having a coupling surface, a back surface, a thickness and at least one opening or open area through the thickness of the core backing component,
wherein at least a portion of the target surface component is disposed within the at least one opening or open area of the core backing component such that the back surface of the core backing component and a portion of the target surface component form the back target surface of the sputtering target, and wherein the coupling surface of the core backing component is coupled to the target surface component at a plurality of localized, discrete welds, and wherein at least a portion of the target surface component is coplanar with the back surface of the core backing component, and wherein the target surface component is continuous at the front target surface in a direction transverse to a longitudinal axis extending through the front target surface and the back target surface.

2. The sputtering target of claim 1, wherein the core backing component comprises a core material.

3. The sputtering target of claim 1, wherein the target material comprises aluminum, copper, titanium, tantalum, cobalt, tungsten, chalcogenides, nickel, ruthenium combinations and alloys thereof.

4. The sputtering target of claim 2, wherein the core material comprises aluminum, copper, chromium, steel, titanium, combinations and alloys thereof.

5. The sputtering target of claim 1, and further comprising at least one additional material positioned between the target surface component and the coupling surface of the core backing component.

6. The sputtering target of claim 5, wherein the at least one additional material is selected from the group consisting of solders, conductive polymers, conductive pastes, adhesives, metals and alloys.

7. The sputtering target of claim 1, wherein the welds are produced by E-beam welding, diffusion welding, LASER welding or a combination thereof.

8. The sputtering target of claim 1, wherein at least one weld includes a filler material or brazing material.

9. The sputtering target of claim 1, wherein at least one weld is reinforced by a mechanical reinforcement.

10. The sputtering target of claim 9, wherein the mechanical reinforcement comprises a wedge design, a locking pin, an interlocking design or a combination thereof.

11. The sputtering target of claim 1, further comprising at least one surface area feature coupled to or located in the back surface of the core backing component, the target surface component or a combination thereof, wherein the surface area feature increases the cooling effectiveness of the target surface component.

12. The sputtering target of claim 11, wherein the at least one surface area feature comprises channels, grooves, bumps, dimples, indentations or a combination thereof.

13. The sputtering target of claim 1, wherein the target material comprises aluminum, copper or a combination thereof.

14. The sputtering target of claim 1, wherein the core backing component is annular and wherein the at least one opening or open area is annular and comprises a first diameter at a first location and a second diameter at a second location, and wherein the first diameter and the second diameter are different.

15. The sputtering target of claim 1, wherein the back target surface of the sputtering target is configured to be in direct contact with a coolant.

16. The sputtering target of claim 1, wherein a first weld is located at a first radial position from the longitudinal axis and a second weld is located at a second radial position from the longitudinal axis, and wherein the first radial position and the second radial position are different.

17. The sputtering target of claim 1, wherein at least one weld of the plurality of welds couples the target surface component and the core backing component at an interface that is perpendicular to the back target surface.

18. A method of forming sputtering target, the method comprising:
positioning at least part of a target surface component within at least one opening or open area of a core backing component so that part of the target surface component and the core backing component form a back surface of the sputtering target and are coplanar along at least a portion of the back surface of the sputtering target; and coupling the target surface component to the core backing component at a plurality of discrete, localized welds, wherein the sputtering target includes a front surface opposite the back surface and the target surface component is continuous at the front surface of the sputtering target in a direction transverse to a longitudinal axis extending through the front surface and the back surface of the sputtering target.

19. The method of claim 18 wherein the coupling step includes localized heating.

20. A sputtering target, comprising:
a front target surface;
a back target surface opposite the front target surface;
a target surface component comprising a target material and having a thickness defined between the front target surface and the back target surface; and
a core backing component having a coupling surface, a back surface, a thickness and at least one opening or open area through the core backing component thickness, wherein at least a portion of the target surface component is disposed within the at least one opening or open area of the core backing component such that the back surface of the core backing component and a portion of the target surface component form the back target surface of the sputtering target, and wherein the coupling surface of the core backing component is coupled to the target surface component at a plurality of localized, discrete welds, and wherein at least a portion of the target surface component is coplanar with the back surface of the core backing component, and wherein a maximum thickness of the target surface component is greater than a maximum thickness of the core backing component.

* * * * *